(12) United States Patent
Ikeda et al.

(10) Patent No.: US 9,698,272 B1
(45) Date of Patent: Jul. 4, 2017

(54) TRANSISTOR AND SEMICONDUCTOR MEMORY DEVICE

(71) Applicant: KABUSHIKI KAISHA TOSHIBA, Minato-ku (JP)

(72) Inventors: Keiji Ikeda, Kawasaki (JP); Chika Tanaka, Fujisawa (JP); Toshinori Numata, Yokkaichi (JP); Tsutomu Tezuka, Yokohama (JP); Yoshihiro Ueda, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/268,146

(22) Filed: Sep. 16, 2016

(30) Foreign Application Priority Data

Mar. 16, 2016 (JP) ................. 2016-052349

(51) Int. Cl.
*H01L 29/10* (2006.01)
*H01L 29/786* (2006.01)
(Continued)

(52) U.S. Cl.
CPC .... *H01L 29/78606* (2013.01); *G11C 11/4091* (2013.01); *H01L 27/10814* (2013.01);
(Continued)

(58) Field of Classification Search
CPC ........... H01L 27/10814; H01L 27/1225; H01L 27/1255; H01L 29/7869; H01L 29/78606;
(Continued)

(56) References Cited

U.S. PATENT DOCUMENTS 7,700,432 B2 * 4/2010 Chaudhry ........... H01L 27/0629
257/379
2006/0208283 A1 * 9/2006 Shimojo ........... H01L 21/76838
257/208
(Continued)

FOREIGN PATENT DOCUMENTS

| JP | 2012-235106 A | 11/2012 |
| JP | 2014-57049 A | 3/2014 |
| JP | 2015-109426 A | 6/2015 |

OTHER PUBLICATIONS

Ki-Whan Song et. al., "A 31 ns Handom Cycle VCAT-Based 4F2 DRAM with Manufacturability and Enhanced Cell Efficiency" IEEE Journal of Solid-State Circuits, vol. 45. No. 4, Apr. 2010, pp. 880-888.

*Primary Examiner* — Yosef Gebreyesus
(74) *Attorney, Agent, or Firm* — Oblon, McClelland, Maier & Neustadt, L.L.P.

(57) ABSTRACT

According to one embodiment, a transistor includes a first electrode, a second electrode, a current path between the first and second electrodes, the current path including an oxide semiconductor layer, a control terminal which controls an on/off action of the current path, an insulating layer between the control terminal and the oxide semiconductor layer, a first oxide layer between the first electrode and the oxide semiconductor layer, the first oxide layer being different from the oxide semiconductor layer, and a second oxide layer between the second electrode and the oxide semiconductor layer, the second oxide layer being different from the oxide semiconductor layer.

20 Claims, 18 Drawing Sheets

(51) Int. Cl.
*H01L 27/12* (2006.01)
*H01L 29/24* (2006.01)
*H01L 27/108* (2006.01)
*G11C 11/4091* (2006.01)

(52) U.S. Cl.
CPC ........ *H01L 27/124* (2013.01); *H01L 27/1225* (2013.01); *H01L 27/1255* (2013.01); *H01L 29/24* (2013.01); *H01L 29/7869* (2013.01); *H01L 29/78696* (2013.01)

(58) Field of Classification Search
CPC H01L 29/24; H01L 29/78696; G11C 11/4091
See application file for complete search history.

(56) References Cited

U.S. PATENT DOCUMENTS

| | | |
|---|---|---|
| 2012/0267696 A1 | 10/2012 | Isobe et al. |
| 2014/0042438 A1 | 2/2014 | Yamazaki |
| 2015/0069320 A1 | 3/2015 | Rabkin et al. |
| 2015/0311256 A1 | 10/2015 | Rabkin et al. |

\* cited by examiner

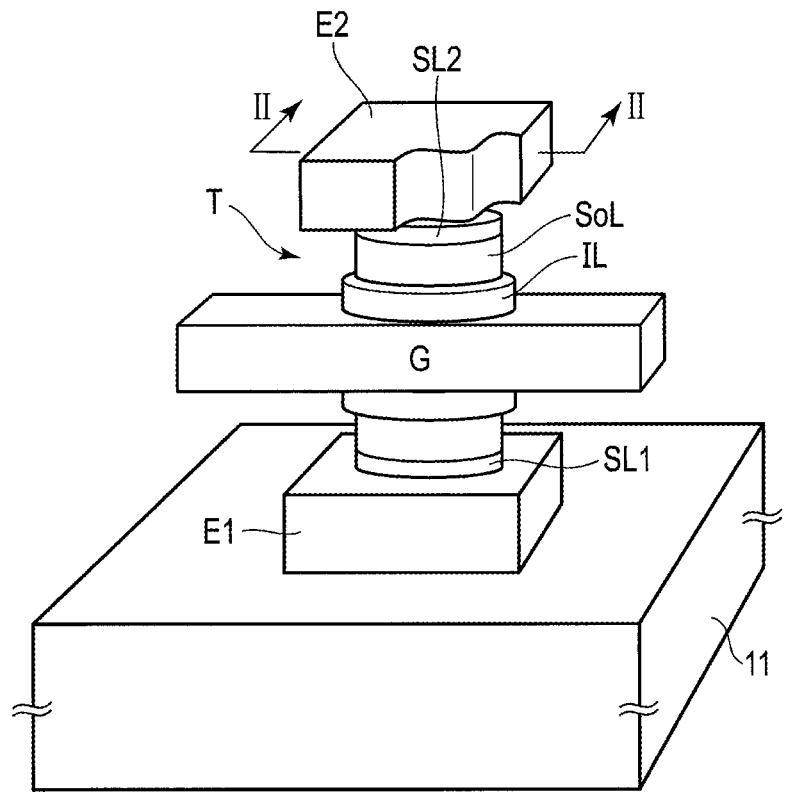
F I G. 1
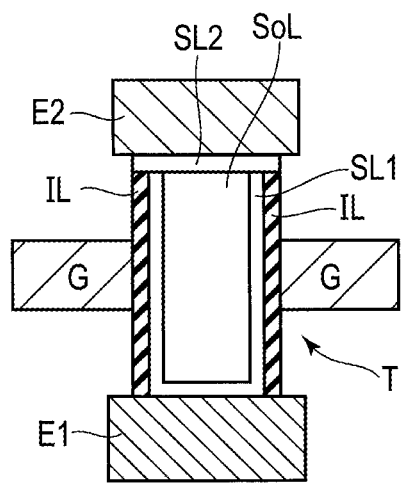
F I G. 2

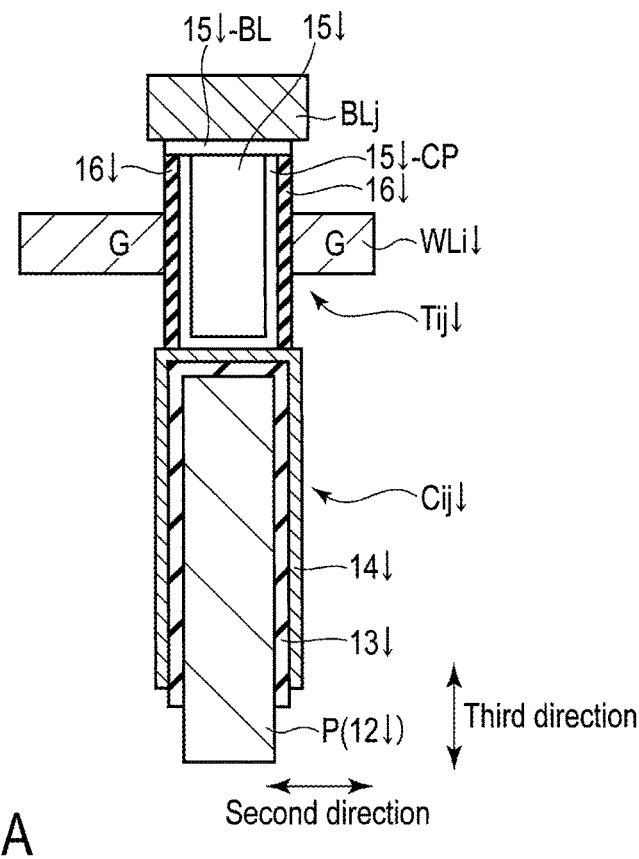
F I G. 6A
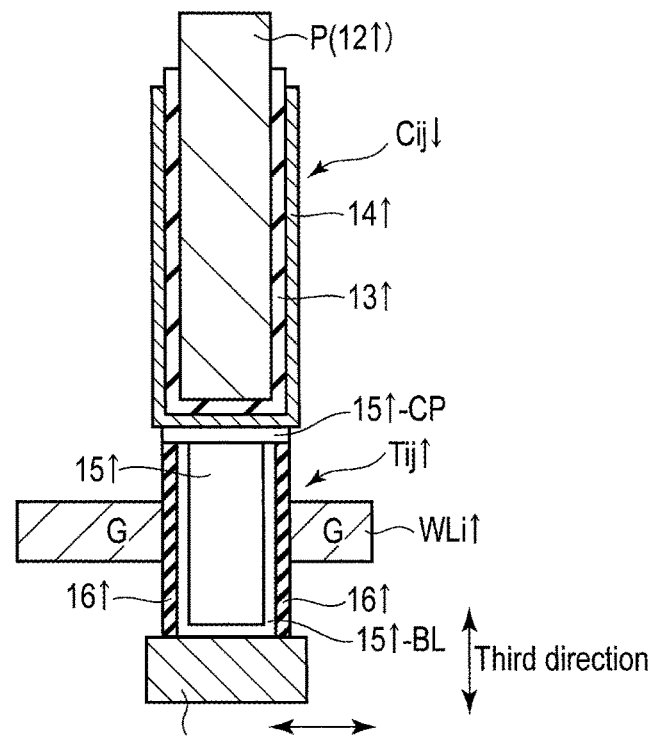
F I G. 6B

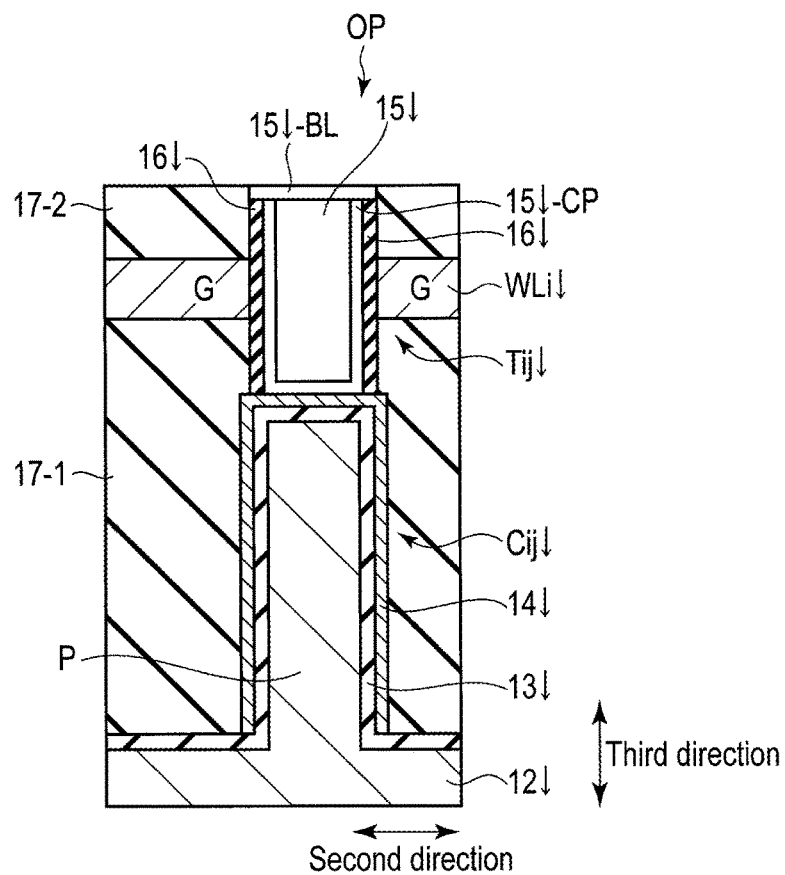
F I G. 19
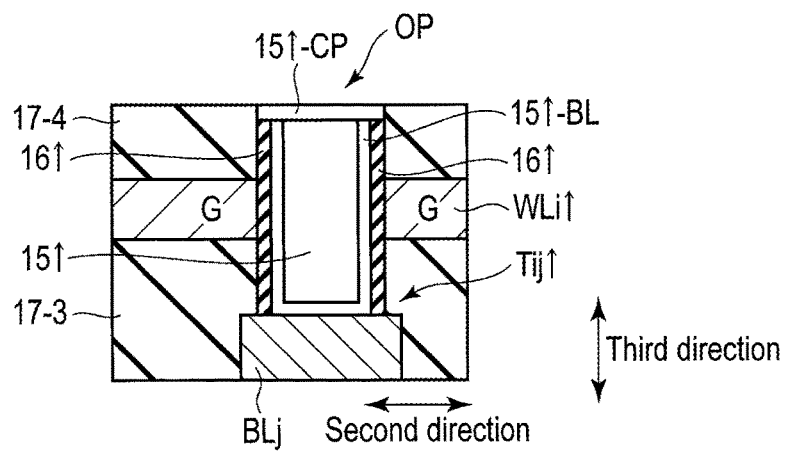
F I G. 20

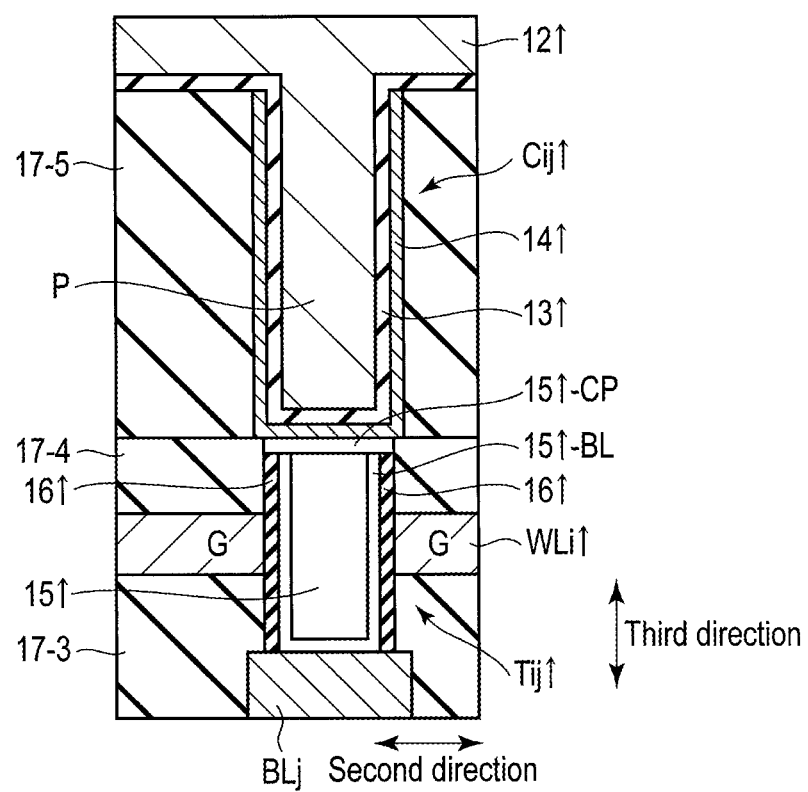
F I G. 22

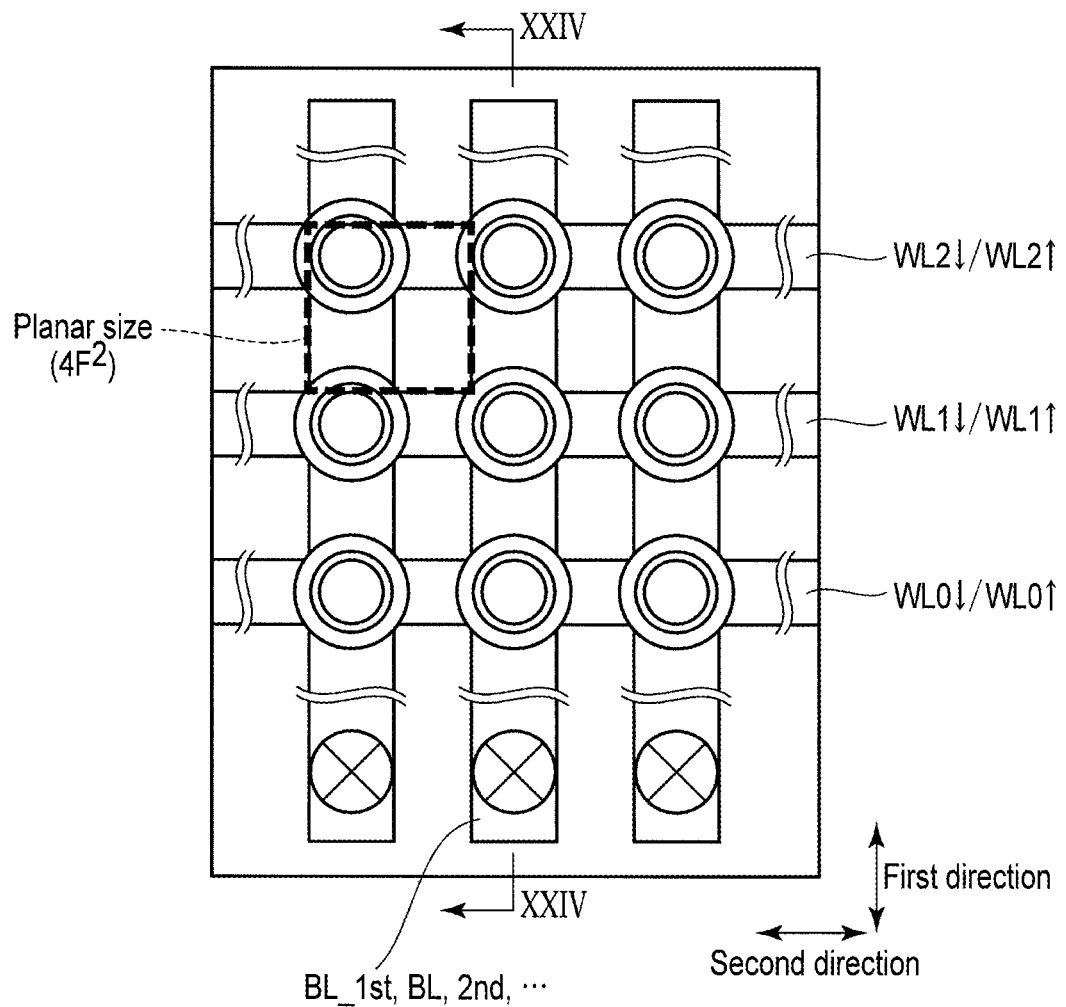
F I G. 23

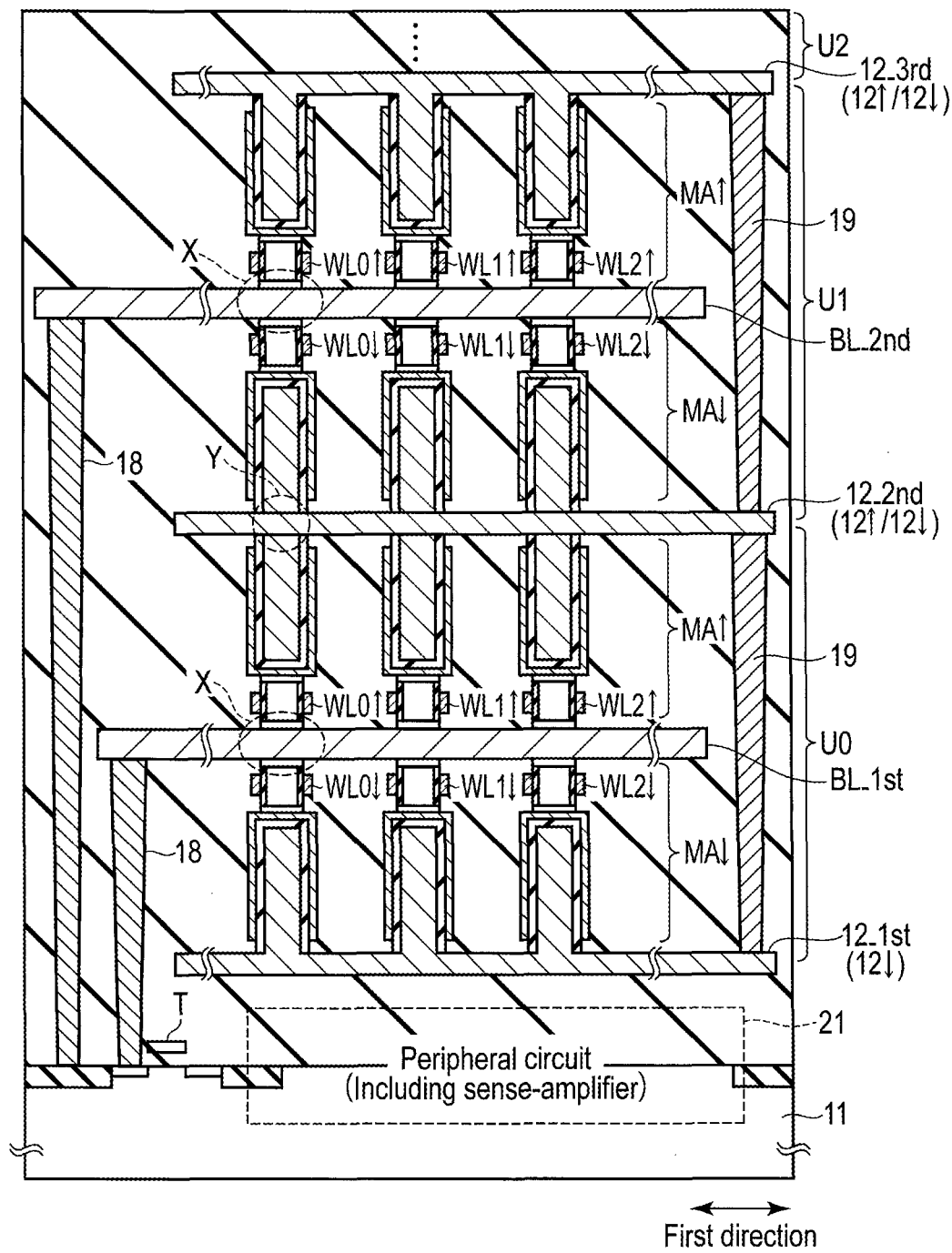
F I G. 24A

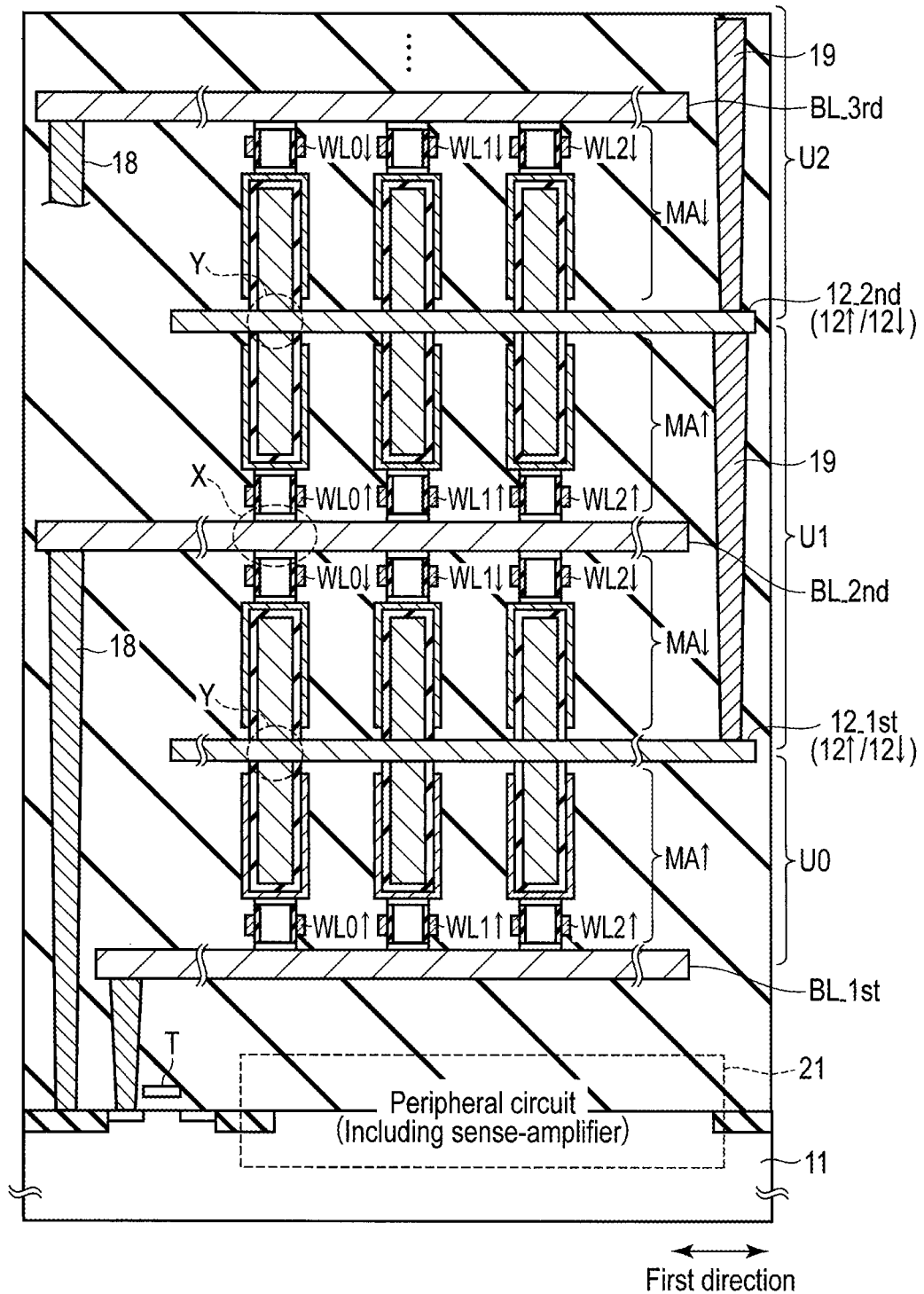
F I G. 24B

TRANSISTOR AND SEMICONDUCTOR MEMORY DEVICE

CROSS-REFERENCE TO RELATED APPLICATIONS

This application is based upon and claims the benefit of priority from Japanese Patent Application No. 2016-052349, filed Mar. 16, 2016, the entire contents of which are incorporated herein by reference.

FIELD

Embodiments described herein relate generally to a transistor and a semiconductor memory device.

BACKGROUND

A transistor such as a field-effect transistor (FET) should preferably be excellent in off-state leakage characteristics, i.e., have an extremely low off-leakage current. Recently, a transistor using an oxide semiconductor layer as a channel is attracting attention because of its off-state leakage current characteristics. If the oxide semiconductor layer is used as a channel, however, a high-resistance metal-oxide layer is formed between the oxide semiconductor layer and metal electrodes, which may cause an increase in the contact resistance.

BRIEF DESCRIPTION OF THE DRAWINGS

FIG. 1 is a perspective view showing an embodiment of a transistor.

FIG. 2 is a cross-sectional view along II-II of FIG. 1.

FIG. 6A is a cross-sectional view along VI-VI of FIG. 5A.

FIG. 6B is a cross-sectional view along VI-VI of FIG. 5B.

FIG. 13 to FIG. 22 are cross-sectional views each showing one of the steps of the manufacturing method of the select transistor.

FIG. 23 is a plan view showing a DRAM of an application example.

FIG. 24A and FIG. 24B are cross-sectional views along XXIV-XXIV of FIG. 23.

DETAILED DESCRIPTION

Figure 3:
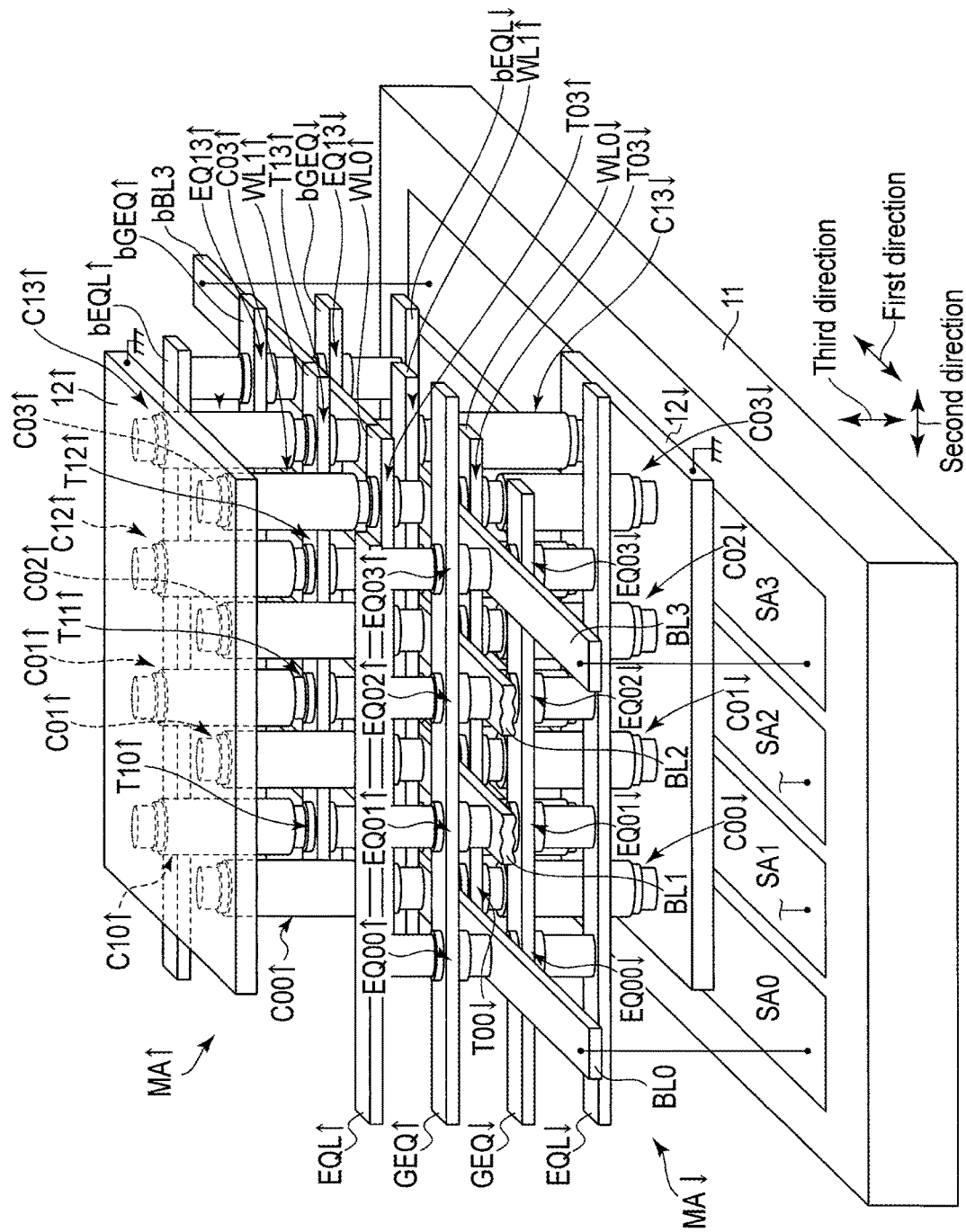
FIG. 3 is a perspective view showing an embodiment of memory cell arrays of a DRAM.

In general, according to one embodiment, a transistor comprises: a first electrode; a second electrode; a current path between the first and second electrodes, the current path including an oxide semiconductor layer; a control terminal which controls an on/off action of the current path; an insulating layer between the control terminal and the oxide semiconductor layer; a first oxide layer between the first electrode and the oxide semiconductor layer, the first oxide layer being different from the oxide semiconductor layer; and a second oxide layer between the second electrode and the oxide semiconductor layer, the second oxide layer being different from the oxide semiconductor layer.

An embodiment will be hereinafter described with reference to the drawings.

Embodiment

The embodiment is directed to a so-called vertical transistor. The following description is based on the premise that the vertical transistor means a transistor in which a channel is located above a surface of a semiconductor substrate and a current flows through the channel in a direction crossing the surface of the semiconductor substrate. More specifically, the embodiment is directed to a transistor using an oxide semiconductor layer as a channel. This is because such a transistor is excellent in its off-state leakage current characteristics.

(Transistor)

FIG. 1 shows the embodiment of the transistor. FIG. 2 is a cross-sectional view along II-II of FIG. 1.

A transistor T is disposed above a surface of a semiconductor substrate 11. The transistor T comprises a first electrode E1, a second electrode E2 above the first electrode E1, a gate electrode G between the first and second electrodes E1 and E2, an oxide semiconductor layer SoL connected between the first and second electrodes E1 and E2 and penetrating the gate electrode G, and a gate insulating layer IL between the gate electrode G and the oxide semiconductor layer SoL.

For example, the first and second electrodes E1 and E2 and the gate electrode G include copper (Cu), tungsten (W) or molybdenum (Mo). For example, the oxide semiconductor layer SoL includes IGZO (InGaZnO) including indium oxide, gallium oxide and zinc oxide.

The oxide semiconductor layer SoL functions as a channel of the transistor T. Therefore, the transistor T excellent in its off-state leakage current characteristics can be implemented. Since a current flows through the channel in a direction crossing the surface of the semiconductor substrate 11, the transistor T is a vertical transistor. The gate electrode G surrounds the side surface of the oxide semiconductor layer SoL and this area functions as the channel. As a result, the large drive current (channel width) can be achieved.

The oxide semiconductor layer SoL includes oxygen. Accordingly, oxygen included in the oxide semiconductor layer SoL may form a metal-oxide layer in each of the interface between the oxide semiconductor layer SoL and the first electrode E1 and the interface between the oxide semiconductor layer SoL and the second electrode E2. The metal-oxide layers are oxides of metal included in the first and second electrodes E1 and E2 and are of high resistance.

In order to avoid the formation of the metal-oxide layers, supplemental layers SL1 and SL2 are provided at least between the oxide semiconductor layer SoL and the first electrode E1 and between the oxide semiconductor layer SoL and the second electrode E2. Supplemental layers SL1 and SL2 function as barrier layers that avoid a reaction between oxygen in the oxide semiconductor layer SoL and metal in the first electrode E1 and a reaction between oxygen in the oxide semiconductor layer SoL and metal in the second electrode E2.

Supplemental layers SL1 and SL2 may be of any material provided the layers function as the barrier layers. However, generally used barrier metal should not be used because the channel of the transistor T is the oxide semiconductor layer SoL. If the barrier metal is used, metal in the barrier metal will react with oxygen in the oxide semiconductor layer SoL to form a high-resistance metal-oxide layer.

Therefore, in the present embodiment, supplemental layers SL1 and SL2 should preferably be oxide layers. In particular, a material excellent in dissociation energy of oxygen is selected for supplemental layers SL1 and SL2 in order to prevent oxygen in supplemental layers SL1 and SL2 from reacting with metal in the first and second electrodes E1 and E2. The dissociation energy of oxygen is energy necessary for dissociation of oxygen from the oxide layers as supplemental layers SL1 and SL2.

For example, the dissociation energy of oxygen in supplemental layers SL1 and SL2 should be greater than that in the oxide semiconductor layer SoL. This is because it becomes possible to avoid formation of high-resistance metal-oxide layers between supplemental layer SL1 and the first electrode E1 and between supplemental layer SL2 and the second electrode E2.

The characteristics of the oxide layers can be expressed by standard energy of formation of oxide instead of the dissociation energy of oxygen. That is, the dissociation energy of oxygen in supplemental layers SL1 and SL2 greater than that in the oxide semiconductor layer SoL means the standard energy of formation of oxide in supplemental layers SL1 and SL2 less than that in the oxide semiconductor layer SoL.

For example, if the standard energy of formation of oxide in supplemental layers SL1 and SL2 is less than that in the oxide semiconductor layer SoL, supplemental layers SL1 and SL2 are oxidized more easily than the oxide semiconductor layer SoL. Therefore, the first and second electrodes E1 and E2 can be prevented from being oxidized by oxygen in supplemental layers SL1 and SL2.

When the oxide semiconductor layer SoL is IGZO (In—Ga—Zn oxide), the material of supplemental layers SL1 and SL2 can be selected as follows.

When supplemental layers SL1 and SL2 are also oxide semiconductor layers, the material of supplemental layers SL1 and SL2 can be selected from materials having greater dissociation energy of oxygen than IGZO, such as indium-gallium-Silicon oxide (ex. InGaSiO) and gallium oxide (ex. $Ga_2O_3$). When supplemental layers SL1 and SL2 are metal-oxide layers, the material of supplemental layers SL1 and SL2 can be selected from materials having greater dissociation energy of oxygen than IGZO and lower resistance than oxide of the first and second electrodes E1 and E2, such as aluminum oxide (ex. $Al_2O_3$) and hafnium oxide (ex. $HfO_2$).

As described above, supplemental layer SL1 is provided between the oxide semiconductor layer SoL and the first electrode E1 and supplemental layer SL2 is provided between the oxide semiconductor layer SoL and the second electrode E2. Therefore, the contact resistance of the transistor T can be reduced and the transistor T having a higher current drive can be implemented.

For example, supplemental layer SL1 may be further provided between the gate insulating layer IL and the oxide semiconductor layer SoL. In this case, supplemental layer SL1 should preferably be an oxide layer having a large bandgap.

For example, the bandgap energy of the oxide layer as supplemental layer SL1 should be greater than that of the oxide semiconductor layer SoL because the transistor T can have higher electron mobility on the same principle as a high-electron-mobility transistor (HEMT) having a double heterostructure.

That is, if the bandgap energy is set as described above, the oxide semiconductor layer SoL which generates carriers is separated from the gate insulating layer IL in the transistor T. As a result, interface scattering can be reduced and higher electron mobility can be implemented.

Each of InGaSiO, $Ga_2O_3$, $Al_2O_3$ and $HfO_2$, which are examples of the material of supplemental layer SL1, has a greater bandgap energy than does IGZO, which is an example of the material of the oxide semiconductor layer SoL. Therefore, in the case where the oxide semiconductor layer SoL is IGZO, the use of InGaSiO, $Ga_2O_3$, $Al_2O_3$, $HfO_2$ or the like as supplemental layer SL1 can provide the transistor T with a higher current drive by high electron mobility.

However, supplemental layer SL1 between the gate insulating layer IL and the oxide semiconductor layer SoL can be omitted. The oxide semiconductor layer SoL is completely surrounded by supplemental layers SL1 and SL2, but may have a portion not surrounded by supplemental layers SL1 and SL2.

As described above, supplemental layers SL1 and SL2 are a factor that implements low contact resistance and high electron mobility in the transistor T.

(DRAM)

An embodiment of a DRAM using the above-described transistor is described.

Figure 4:
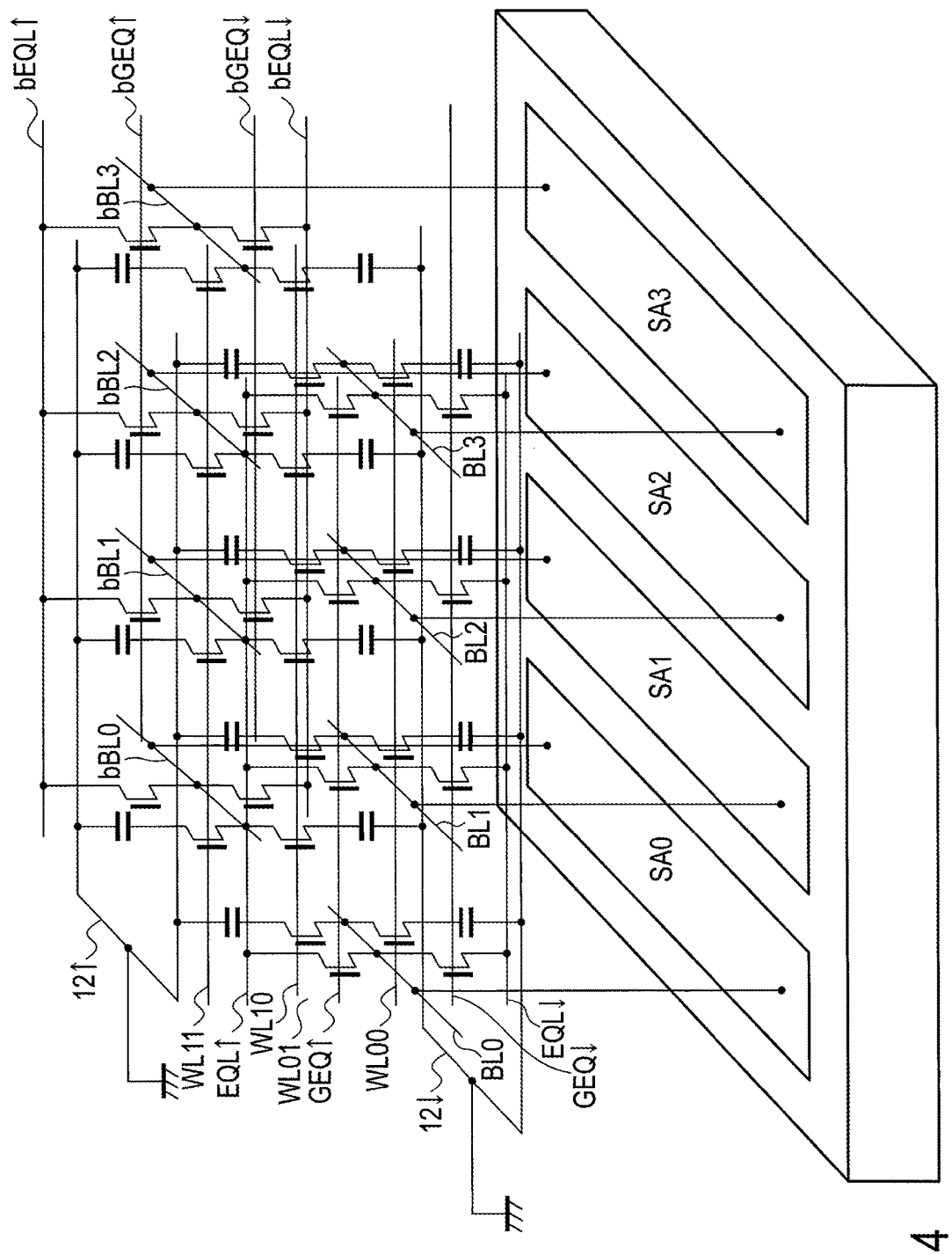
FIG. 4 is a circuit diagram showing an equivalent circuit of the device structure of FIG. 3.

FIG. 3 shows the embodiment of the DRAM. FIG. 4 shows an equivalent circuit of the device structure of FIG. 3.

The present embodiment is an example of a structure in which two memory cell arrays $MA_↓$ and $MA_↑$ are stacked on a semiconductor substrate 11. However, any number of memory cell arrays may be stacked on the semiconductor substrate 11 provided that the number is $2^n$ (n= 0, 1, 2, 3, . . . ). That is, one of two memory cell arrays $MA_↓$ and $MA_↑$ may be omitted. Otherwise, pairs of two memory cell arrays $MA_↓$ and $MA_↑$ may be stacked on the semiconductor substrate 11.

The semiconductor substrate 11 is, for example, a single crystal silicon layer. Peripheral circuits of the memory cell arrays are disposed on the semiconductor substrate 11. The peripheral circuits are CMOS circuits for driving the memory cell arrays at the time of reading/writing. The peripheral circuits include an address decode circuit, a read circuit (including a sense amplifier), a write circuit and the like. For example, sense amplifiers SA0, SA1, SA2 and SA3 are disposed on the semiconductor substrate 11.

Sense amplifiers SA0, SA1, SA2 and SA3 as the peripheral circuits include transistors (P- and N-channel FETs) using the semiconductor substrate 11 as a channel (current path). The transistors are, for example, horizontal transistors having a channel parallel to the surface of the semiconductor substrate 11. However, the structure of the transistors in sense amplifiers SA0, SA1, SA2 and SA3 is not particularly limited.

Two memory cell arrays $MA_↓$ and $MA_↑$ are disposed above the surface of the semiconductor substrate 11, i.e., above the peripheral circuits such as sense amplifiers SA0, SA1, SA2 and SA3.

Memory cell array $MA_↓$ includes word lines $WL0_↓$ and $WL1_↓$, bit lines BL0, BL1, BL2, BL3, bBL0, bBL1, bBL2 and bBL3 and memory cells $MC00_\downarrow$, $MC01_\downarrow$, $MC02_\downarrow$, $MC03_\downarrow$, $MC10_\downarrow$, $MC11_\downarrow$, $MC12_\downarrow$ and $MC13_\downarrow$. The number of word lines, the number of bit lines and the number of memory cells are not limited to this example.

Bit lines BL0, BL1, BL2, BL3, bBL0, bBL1, bBL2 and bBL3 extend in a first direction parallel to the surface of the semiconductor substrate 11. Word lines $WL0_\downarrow$ and $WL1_\downarrow$ extend in a second direction parallel to the surface of the semiconductor substrate 11 and crossing the first direction. For example, bit lines BL0, BL1, BL2, BL3, bBL0, bBL1, bBL2 and bBL3 and word lines $WL0_\downarrow$ and $WL1_\downarrow$ are formed of a metal material such as copper (Cu), tungsten (W) or molybdenum (Mo).

The present embodiment shows an example of a 1-cell/1-bit type in which one bit is stored in one memory cell $MC0j_\downarrow$ or $MC1j_\downarrow$. Accordingly, one of bit lines BLj and bBLj is electrically connected to a sense amplifier SAj. Sense amplifier SAj determines read data based on data from one memory cell $MC0j_\downarrow$ or $MC1j_\downarrow$ (j is 0, 1, 2 or 3).

However, the present embodiment is not limited to the 1-cell/1-bit type. For example, the present embodiment is applicable to a 2-cell/1-bit type in which one bit (complementary data) is stored in two memory cells $MC0j_\downarrow$. Sense amplifier SAj determines read data by comparing data from two memory cells $MC0j_\downarrow$ and $MC1j_\downarrow$.

Memory cell $MC0j_\downarrow$ (j is 0, 1, 2 or 3) is connected between a plate electrode $12_\downarrow$ and bit lines BL0, BL1, BL2 and BL3. Plate electrode $12_\downarrow$ is set to a fixed potential (for example, a ground potential). The present embodiment shows an example in which bit lines BL0, BL1, BL2 and BL3 are disposed above plate electrode $12_\downarrow$. However, plate electrode $12_\downarrow$ may be disposed above bit lines BL0, BL1, BL2 and BL3.

If bit lines BL0, BL1, BL2 and BL3 are disposed above plate electrode $12_1$, bit lines BL0, BL1, BL2 and BL3 can be shared by two memory cell arrays $MA_\downarrow$ and $MA_\uparrow$ as described later. If plate electrode $12_\downarrow$ is disposed above bit lines BL0, BL1, BL2 and BL3, two plate electrodes $12_\downarrow$ and $12_\uparrow$ can be integrated.

Memory cell $MCij_\downarrow$ (i is 0 or 1, j is 0, 1, 2 or 3) comprises a capacitor $Cij_\downarrow$ and a select transistor $Tij_\downarrow$.

Figure 5A:
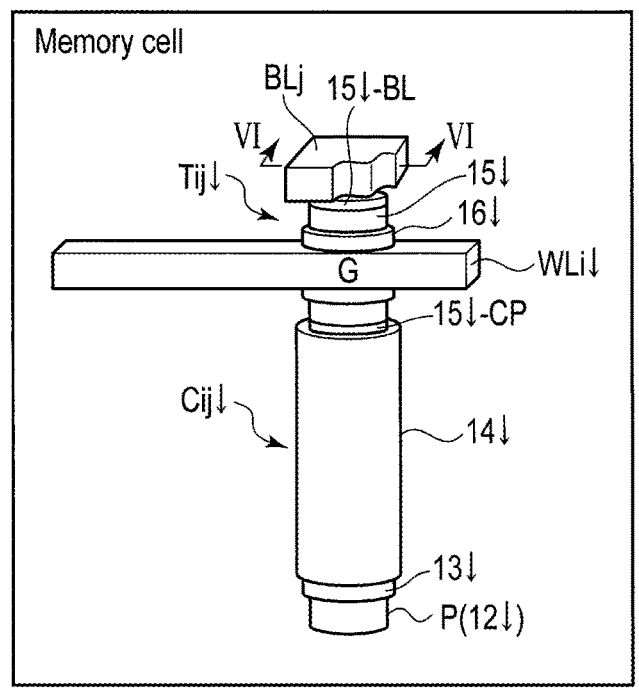
FIG. 5A and FIG. 5B are perspective views showing details of a capacitor and a select transistor.

For example, as shown in FIG. 5A and FIG. 6A, capacitor $Cij_\downarrow$ comprises a pillar portion P as plate electrode $12_\downarrow$, an insulating portion $13_\downarrow$ covering the pillar portion P and a cell electrode portion $14_\downarrow$ covering insulating portion $13_\downarrow$. Select transistor $Tij_\downarrow$ comprises an oxide semiconductor layer (semiconductor pillar) $15_\downarrow$ as a channel (current path), supplemental layers $15_\downarrow$-CP and $15_\downarrow$-BL, a gate insulating layer $16_\downarrow$ and a word line $WLi_\downarrow$.

Capacitor $Cij_\downarrow$ is a so-called fin capacitor. Capacitor $Cij_\downarrow$ is columnar, but the shape is not limited to this. Plate electrode $12_\downarrow$ and cell electrode portion $14_\downarrow$ are formed of a metal material such as copper or tungsten. For example, insulating portion $13_\downarrow$ includes copper oxide, tungsten oxide, silicon oxide, aluminum oxide, hafnium oxide, zirconium oxide, tantalum oxide, a stacked layer structure of those, etc.

Select transistor $Tij_\downarrow$ is, for example, a vertical transistor which comprises oxide semiconductor layer $15_\downarrow$ as a channel disposed above the semiconductor substrate 11 and crossing the surface of the semiconductor substrate 11. Oxide semiconductor layer $15_\downarrow$ penetrates word line $WLi_\downarrow$. In other words, word line $WLi_\downarrow$ surrounds the side surface (periphery) of oxide semiconductor layer $15_\downarrow$.

In this case, a channel width of select transistor $Tij_\downarrow$ is in a circumferential direction of semiconductor layer $15_\downarrow$ and thus the current drive of select transistor $Tij_\downarrow$ can be increased. On the assumption that a pitch of each of word line WLi and bit line BLj is 2F, a horizontal size of memory cell $MCij_\downarrow$ can be $4F_2$.

As shown in FIG. 3, two memory cells $MCij_\downarrow$ and $MCij_\uparrow$ are disposed in an area of $4F_2$ in the present embodiment. That is, 2-cell/$4F_2$ can be realized. This means that the horizontal size per cell can be further reduced by increasing the number of memory cell arrays $MA_\downarrow$ and $MA_\uparrow$ stacked on the semiconductor substrate 11. If n memory cells are stacked on the semiconductor substrate 11, n-cell/$4F_2$ can be realized.

It should be noted that F is a feature size (the minimum wire width), the horizontal size means a size in a plane parallel to the surface of the semiconductor substrate 11, n-cell means n cells and n is a natural number not less than one (1, 2, 3, . . . ).

For example, oxide semiconductor layer $15_\downarrow$ includes IGZO (InGaZnO). A transistor using oxide semiconductor layer $15_\downarrow$ as a channel can be formed by a low-temperature process of, for example, about 200° C., and thus does not impose thermal stress on the peripheral circuits in the surface region of the semiconductor substrate 11 in a wafer production process. In this regard, such a transistor is quite effective at making a three-dimensional DRAM. In addition, the leakage current in the off-state can be greatly reduced by the transistor using oxide semiconductor layer $15_\downarrow$ as a channel compared to a general silicon channel transistor. Therefore, a DRAM having a very long data retention time can be implemented.

For example, in the case of select transistor $Tij_\downarrow$ using silicon as a channel, the retention time is about 64 ms. Consequently, data should be frequently refreshed (rewritten). In contrast, in the case of select transistor $Tij_\downarrow$ using IGZO as a channel, the retention time is about 10 days. Therefore, data refresh does not affect system performance.

Supplemental layers $15_\downarrow$-CP and $15_\downarrow$-BL are provided at least between oxide semiconductor layer $15_\downarrow$ and cell electrode portion $14_\downarrow$ and between oxide semiconductor layer $15_\downarrow$ and bit line BLj. Supplemental layers $15_\downarrow$-CP and $15_\downarrow$-BL function as barrier layers that avoid a reaction between oxygen in oxide semiconductor layer $15_\downarrow$ and metal in cell electrode portion $14_\downarrow$ and a reaction between oxygen in oxide semiconductor layer $15_\downarrow$ and metal in bit line BLj.

In the same manner as supplemental layers SL1 and SL2 of the transistor T of FIG. 1 and FIG. 2, supplemental layers $15_\downarrow$-CP and $15_\downarrow$-BL should preferably be oxide layers. In particular, a material excellent in dissociation energy of oxygen is selected for supplemental layers $15_\downarrow$-CP and $15_\downarrow$-BL in order to prevent oxygen in supplemental layers $15_\downarrow$-CP and $15_\downarrow$-BL from reacting with metal in cell electrode portion $14_\downarrow$ and bit line BLj.

For example, the dissociation energy of oxygen in supplemental layers $15_\downarrow$-CP and $15_\downarrow$-BL should be greater than that in oxide semiconductor layer $15_\downarrow$. This is because it becomes possible to avoid formation of high-resistance metal-oxide layers (for example, oxide of copper, tungsten, molybdenum or the like) between supplemental layer $15_\downarrow$-CP and cell electrode portion $14_\downarrow$ and between supplemental layer $15_\downarrow$-BL and bit line BLj.

Examples of the materials of oxide semiconductor layer $15_\downarrow$ and supplemental layers $15_\downarrow$-CP and $15_\downarrow$-BL are the same as those of oxide semiconductor layer SoL and supplemental layers SL1 and SL2 in the transistor T of FIG. 1 and FIG. 2, and thus the description is omitted.

As described above, supplemental layer $15_\downarrow$-CP is provided between oxide semiconductor layer $15_\downarrow$ and cell electrode portion $14_\downarrow$ and supplemental layer $15_\downarrow$-BL is provided between oxide semiconductor layer $15_\downarrow$ and bit line BLj. Therefore, the contact resistance of select transistor $Tij_\downarrow$ can be reduced and select transistor $Tij_\downarrow$ having a large current driving force can be implemented.

In the present embodiment, supplemental layer $15_\downarrow$-CP is also provided between oxide semiconductor layer $15_\downarrow$ and gate insulating layer $16_\downarrow$ for reasons for a manufacturing process, which will be described later in detail in the item about the manufacturing process. In this case, the bandgap energy of the oxide layer as supplemental layer $15_\downarrow$-CP should preferably be greater than that of oxide semiconductor layer $15_\downarrow$ for the same reason as described in the embodiment of the transistor T of FIG. 1 and FIG. 2.

Semiconductor layer $15_\downarrow$ as a channel of select transistor $Tij_\downarrow$ is columnar, but the shape is not limited to this.

In memory cell array $MA_\downarrow$ of the present embodiment, one memory cell $MCij_\downarrow$ (i=0) is connected to one bit line BLj (j is 0, 1, 2 or 3), and one memory cell $MCij_\downarrow$ (i=1) is connected to one bit line bBLj (j is 0, 1, 2 or 3). This is to simplify the drawings, and memory cells may be connected to each of bit lines BLj and bBLj.

An equalizing transistor (FET) $EQij_\downarrow$ (i is 0 or 1, j is 0, 1, 2 or 3) is disposed at an end of memory cell array $MA_\downarrow$, in the first direction. For example, equalizing transistor $EQij_\downarrow$ (i=0) precharges bit line BLj to a predetermined potential (for example, Vdd/2) (Vdd is a power-supply potential) Vpre in preparation for reading. In the same manner, equalizing transistor $EQij_\downarrow$ (i=1) precharges bit line bBLj to the predetermined potential Vpre in preparation for reading.

Equalizing transistor $EQij_\downarrow$ is called an equalizing transistor because it equalizes two bit lines BLj and bBLj to the predetermined potential in preparation for reading. Equalizing transistor $EQij_\downarrow$ is disposed above the surface of the semiconductor substrate 11 in the same manner as memory cell $MCij_\downarrow$.

For example, equalizing transistor $EQij_\downarrow$ is disposed in the same layer as memory cell $MCij_\downarrow$ (an area which is the same distance from the surface of the semiconductor substrate 11). The distance between equalizing transistor $EQij_\downarrow$ and bit lines BLj and bBLj can thereby be reduced, which makes it possible to charge and discharge (i.e., equalize) bit lines BLj and bBLj at high speed.

Equalizing transistor $EQij_\downarrow$ (i=0) is connected between an equalizing potential line $EQL_\downarrow$ having the predetermined potential Vpre and bit lines BL0, BL1, BL2 and BL3. In the same manner, equalizing transistor $EQij_\downarrow$ (i=1) is connected between equalizing potential line $EQL_\downarrow$ having the predetermined potential Vpre and bit lines bBL0, bBL1, bBL2 and bBL3. Equalizing potential line $EQL_\downarrow$ extends in the second direction.

Figure 7A:
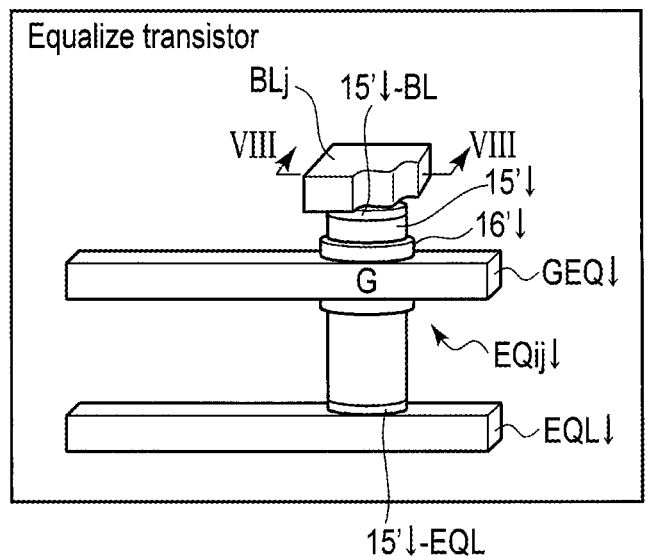
FIG. 7A and FIG. 7B are perspective views showing details of an equalizing transistor.
Figure 8A:
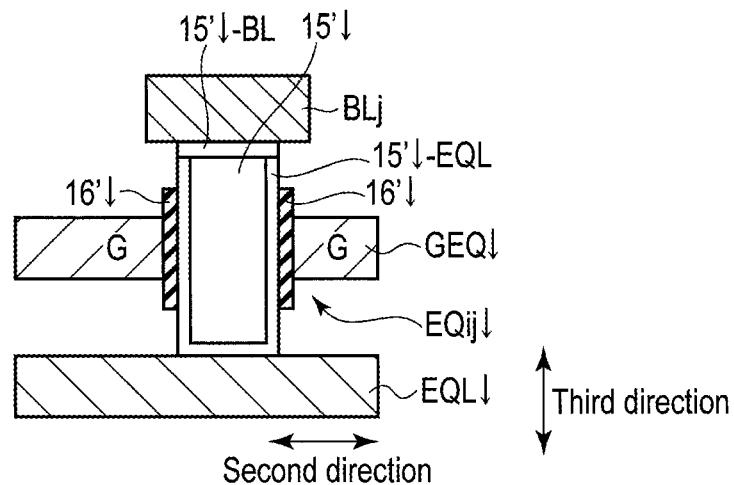
FIG. 8A is a cross-sectional view along VIII-VIII of FIG. 7A.

For example, as shown in FIG. 7A and FIG. 8A, equalizing transistor $EQij_\downarrow$ comprises an oxide semiconductor layer (semiconductor pillar) $15'_\downarrow$ as a channel (current path), a gate insulating layer $16'_\downarrow$, gate equalizing line GEQ, and supplemental layers $15'_\downarrow$-EQL and $15'_\downarrow$-BL. Gate equalizing line $GEQ_\downarrow$ extends in the second direction.

For example, equalizing transistor $EQij_\downarrow$ is a vertical transistor having a channel crossing the surface of the semiconductor substrate 11 in the same manner as select transistor $Tij_\downarrow$. Accordingly, a channel width of equalizing transistor $EQij_\downarrow$ is in a circumferential direction of oxide semiconductor layer $15'_\downarrow$ and thus the driving force of equalizing transistor $EQij_\downarrow$ can be increased.

For example, equalizing transistor $EQij_\downarrow$ uses oxide semiconductor layer $15'_\downarrow$ as a channel in the same manner as select transistor $Tij_\downarrow$. Therefore, equalizing transistor $EQij_\downarrow$ is excellent in its off-state leakage current characteristics. In addition, for example, equalizing transistor $EQij_\downarrow$ comprises supplemental layers $15'_\downarrow$-EQL and $15'_\downarrow$-BL in the same manner as select transistor $Tij_\downarrow$. Therefore, equalizing transistor $EQij_\downarrow$ has low contact resistance and high channel mobility.

The structure of equalizing transistor $EQij_\downarrow$ is the same as that of select transistor $Tij_\downarrow$ and thus detailed description is omitted. Oxide semiconductor layer $15'_\downarrow$, gate insulating layer $16'_\downarrow$, gate equalizing line $GEQ_\downarrow$ and supplemental layers $15'_\downarrow$-EQL and $15'_\downarrow$-BL correspond to oxide semiconductor layer $15_\downarrow$, gate insulating layer $16_\downarrow$, word line $WLi_\downarrow$ and supplemental layers $15_\downarrow$-CP and $15_\downarrow$-BL, respectively.

Memory cell array $MA_\uparrow$ is disposed on memory cell array $MA_\downarrow$. In other words, two memory cell arrays $MA_\downarrow$ and $MA_\uparrow$ are stacked in a third direction crossing the first and second directions.

The structure of memory cell array $MA_\uparrow$ is symmetrical to the structure of memory cell array $MA_\downarrow$ with respect to bit lines BL0, BL1, BL2, BL3, bBL0, bBL1, bBL2 and bBL3. In the present embodiment, bit lines BL0, BL1, BL2, BL3, bBL0, bBL1, bBL2 and bBL3 are shared by two memory cell arrays $MA_\downarrow$ and $MA_\uparrow$.

Memory cell array $MA_\uparrow$ includes word lines $WL0_\uparrow$ and $WL1_\uparrow$, bit lines BL0, BL1, BL2, BL3, bBL0, bBL1, bBL2 and bBL3 and memory cells $MC00_\uparrow$, $MC01_\uparrow$, $MC02_\uparrow$, $MC03_\uparrow$, $MC10_\uparrow$, $MC11_\uparrow$, $MC12_\uparrow$ and $MC13_\uparrow$. The number of word lines, the number of bit lines and the number of memory cells are not limited to this example.

Word lines $WL0_\uparrow$ and $WL1_\uparrow$ extend in the second direction. Memory cell array $MA_\uparrow$ is of the 1-cell/1-bit type. In this case, for example, word line $WL1_\uparrow$, bit lines bBL0, bBL1, bBL2 and bBL3 and memory cells $MC10_\uparrow$, $MC11_\uparrow$, $MC12_\uparrow$ and $MC13_\uparrow$ can be omitted.

Memory cell $MC0j_\uparrow$ (j is 0, 1, 2 or 3) is connected between a plate electrode $12_\uparrow$ and bit lines BL0, BL1, BL2 and BL3. Plate electrode $12_\uparrow$ is set to a fixed potential (for example, a ground potential). Plate electrode $12_\uparrow$ is disposed above bit lines BL0, BL1, BL2 and BL3, but bit lines BL0, BL1, BL2 and BL3 may be disposed above plate electrode $12_\uparrow$.

Figure 5B:
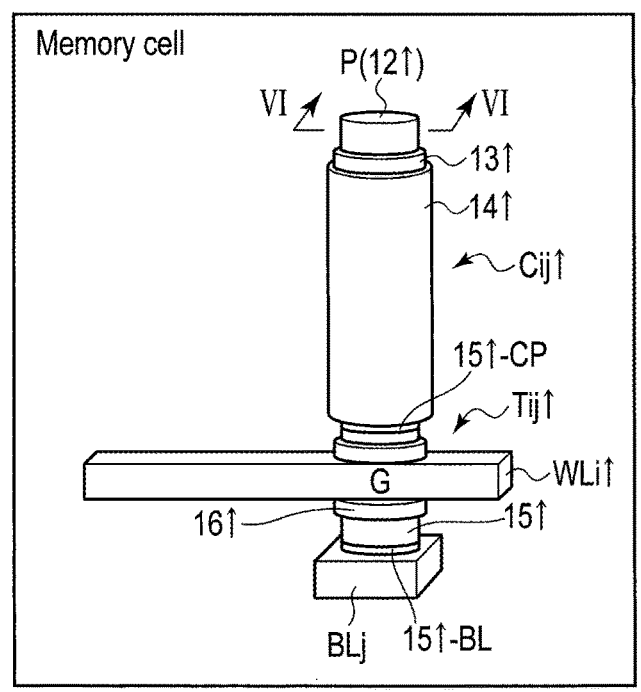

Memory cell $MCij_\uparrow$ (i is 0 or 1, j is 0, 1, 2 or 3) comprises a capacitor $Cij_\uparrow$ and a select transistor $Tij_\uparrow$. For example, as shown in FIG. 5B and FIG. 6B, capacitor $Cij_\uparrow$ comprises a pillar portion P as plate electrode $12_\uparrow$, an insulating portion $13_\uparrow$ covering the pillar portion P and a cell electrode portion $14_\uparrow$ covering insulating portion $13_\uparrow$. Select transistor $Tij_\uparrow$ comprises an oxide semiconductor layer (semiconductor pillar) $15_\uparrow$ as a channel, supplemental layers $15_\uparrow$-BL and $15_\uparrow$-CP, a gate insulating layer $16_\uparrow$ and a word line $WLi_\uparrow$.

Capacitor $Cij_\uparrow$ is a so-called fin capacitor. Capacitor $Cij_\uparrow$ is columnar, but the shape is not limited to this. Plate electrode $12_\uparrow$ and cell electrode portion $14_\uparrow$ are formed of a metal material such as copper, tungsten or molybdenum. For example, insulating portion $13_\uparrow$ includes copper oxide, tungsten oxide, molybdenum oxide, silicon oxide, aluminum oxide, hafnium oxide, zirconium oxide, tantalum oxide, a stacked layer structure of those, etc.

Select transistor $Tij_\uparrow$ is, for example, a vertical transistor which comprises oxide semiconductor layer $15_\uparrow$ as a channel disposed above the semiconductor substrate 11 and crossing the surface of the semiconductor substrate 11. Select transistor $Tij_\uparrow$ has low contact resistance and high electron mobility because of supplemental layers $15_\downarrow$-CP and $15_\downarrow$-BL.

Oxide semiconductor layer $15_\uparrow$ as a channel of select transistor $Tij_\uparrow$ is columnar, but the shape is not limited to this. For example, gate insulating layer $16_\uparrow$ is formed of an insulator such as silicon oxide. For example, word line $WLi_\uparrow$ is formed of a metal material such as copper, tungsten or molybdenum.

In memory cell array $MA_\uparrow$, memory cells may be connected to one bit line BLj or bBLj (j is 0, 1, 2 or 3).

An equalizing transistor (FET) $EQij_\uparrow$ (i is 0 or 1, j is 0, 1, 2 or 3) is disposed at an end of memory cell array $MA_\uparrow$ in the first direction. The structure and the function of equalizing transistor $EQij_\uparrow$ in memory cell array $MA_\uparrow$ are the same as those of equalizing transistor $EQij_\downarrow$ in memory cell array $MA_\uparrow$.

Figure 7B:
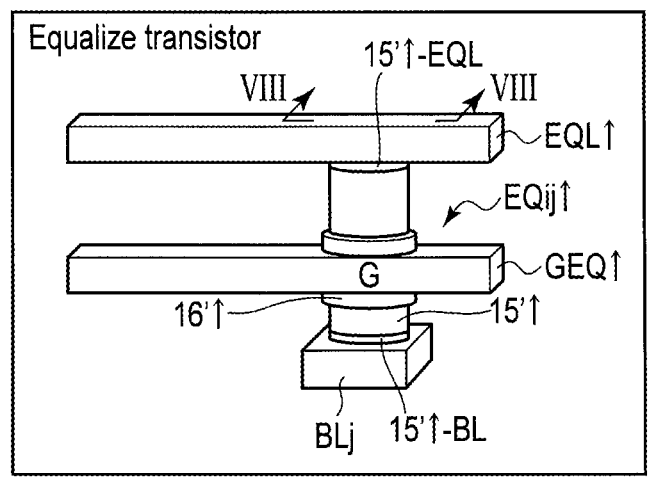
Figure 8B:
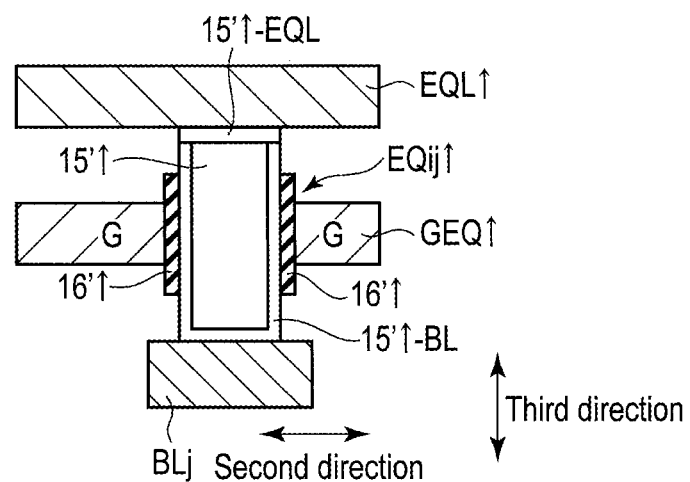
FIG. 8B is a cross-sectional view along VIII-VIII of FIG. 7B.

For example, as shown in FIG. 7B and FIG. 8B, equalizing transistor $EQij_\uparrow$ comprises an oxide semiconductor layer (semiconductor pillar) $15'_\uparrow$ as a channel, supplemental layers $15'_\uparrow$-BL and $15'_\uparrow$-EQL, a gate insulating layer $16'_\uparrow$ and a gate equalizing line $GEQ_\uparrow$. Gate equalizing line $GEQ_\uparrow$ extends in the second direction.

For example, equalizing transistor $EQij_\uparrow$ is a vertical transistor having a channel crossing the surface of the semiconductor substrate 11 in the same manner as select transistor $Tij_\uparrow$. Accordingly, a channel width of equalizing transistor $EQij_\uparrow$ is in a circumferential direction of oxide semiconductor layer $15'_\uparrow$ and thus the driving force of equalizing transistor $EQij_\uparrow$ can be increased.

For example, equalizing transistor $EQij_\uparrow$ uses oxide semiconductor layer $15'_\uparrow$ as a channel in the same manner as select transistor $Tij_\uparrow$. Therefore, equalizing transistor $EQij_\uparrow$ is excellent in its off-state leakage current characteristics. In addition, for example, equalizing transistor $EQij_\uparrow$ comprises supplemental layers $15'_\uparrow$-BL and $15'_\uparrow$-EQL in the same manner as select transistor $Tij_\uparrow$. Therefore, equalizing transistor $EQij_\uparrow$ has low contact resistance and high electron mobility.

The structure of equalizing transistor $EQij_\uparrow$ is the same as that of select transistor $Tij_\uparrow$ and thus detailed description is omitted. Oxide semiconductor layer $15'_\uparrow$, gate insulating layer $16'_\uparrow$, gate equalizing line $GEQ_\uparrow$ and supplemental layers $15'_\uparrow$-BL and $15'_\uparrow$-EQL correspond to oxide semiconductor layer $15_\uparrow$, gate insulating layer $16_\uparrow$, word line $WLi_\uparrow$ and supplemental layers $15_\uparrow$-BL and $15_\uparrow$-CP, respectively.

In the present embodiment, equalizing transistors $EQij_\downarrow$ and $EQij_\uparrow$ are connected to the bottom and top of bit lines BL0, BL1, BL2, BL3, bBL0, bBL1, bBL2 and bBL3, respectively, but one of the equalizing transistors may be omitted.

For example, equalizing transistor $EQij_\downarrow$ may be omitted such that equalizing transistor $EQij_\uparrow$ is provided only on the memory cell array $MA_\uparrow$ side. Otherwise, equalizing transistor $EQij_\uparrow$ may be omitted such that equalizing transistor $EQij_\downarrow$ is provided only on the memory cell array $MA_\downarrow$ side. This is possible because bit lines BL0, BL1, BL2, BL3, bBL0, bBL1, bBL2 and bBL3 are shared by two memory cell arrays $MA_\downarrow$ and MAT.

However, if equalizing transistors $EQij_\downarrow$ and $EQij_\uparrow$ are connected to the bottom and top of bit lines BL0, BL1, BL2, BL3, bBL0, bBL1, bBL2 and bBL3, respectively, as in the present embodiment, the driving force of equalizing transistors $EQij_\downarrow$ and $EQij_\uparrow$ is increased, with the result that the speed of charge and discharge (i.e., equalization) of bit lines BL0, BL1, BL2, BL3, bBL0, bBL1, bBL2 and bBL3 can be further increased.

(Manufacturing Method)

An example of a manufacturing method of the above DRAM is described.

An example of a manufacturing method of the select transistors, the main portion of the embodiment, is described below.

A manufacturing method of select transistor $Tij_\downarrow$ of FIG. 5A and FIG. 6A is shown in FIG. 9, FIG. 10, FIG. 13, FIG. 15, FIG. 17, FIG. 19 and FIG. 21. A manufacturing method of select transistor $Tij_\uparrow$ of FIG. 5B and FIG. 6B is shown in FIG. 11, FIG. 12, FIG. 14, FIG. 16, FIG. 18, FIG. 20 and FIG. 22. The manufacturing methods shown in FIG. 9 to FIG. 22 are directly applicable to equalizing transistors $EQij_\downarrow$ and $EQij_\uparrow$ of FIG. 7A, FIG. 8A, FIG. 7B and FIG. 8B.

First, as shown in FIG. 9 to FIG. 12, capacitor $Cij_\downarrow$ or bit line BLj is formed. Capacitor $Cij_\downarrow$ comprises plate electrode $12_\downarrow$ (including the pillar portion P), insulating portion $13_\downarrow$ and cell electrode portion $14_\downarrow$. These can easily be formed by a combination of a deposition method such as chemical vapor deposition (CVD), a processing method such as a photoengraving process (PEP) and an etching/polishing method such as reactive ion etching (RIB)/chemical mechanical polishing (CMP).

In a similar way, word line $WLi_\downarrow$ or $WLi_\uparrow$ extending in the second direction is formed on capacitor $Cij_\downarrow$ or bit line BLj. The first, second and third directions correspond to those of FIG. 3 and FIG. 4.

Figure 9:
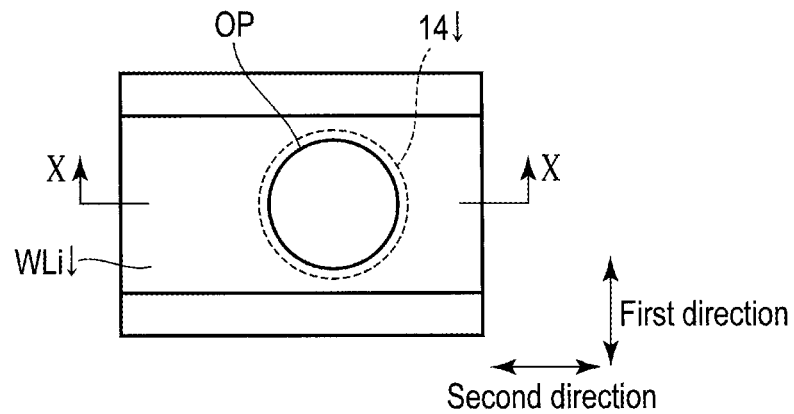
FIG. 9 is a plan view showing one of steps of a manufacturing method of the select transistor.
Figure 10:
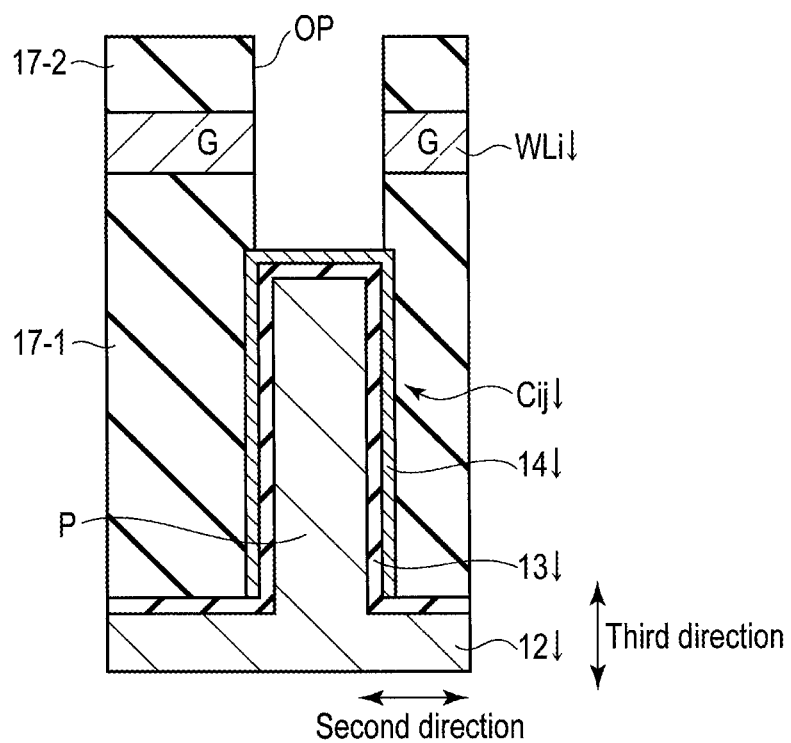
FIG. 10 is a cross-sectional view along X-X of FIG. 9.
Figure 11:
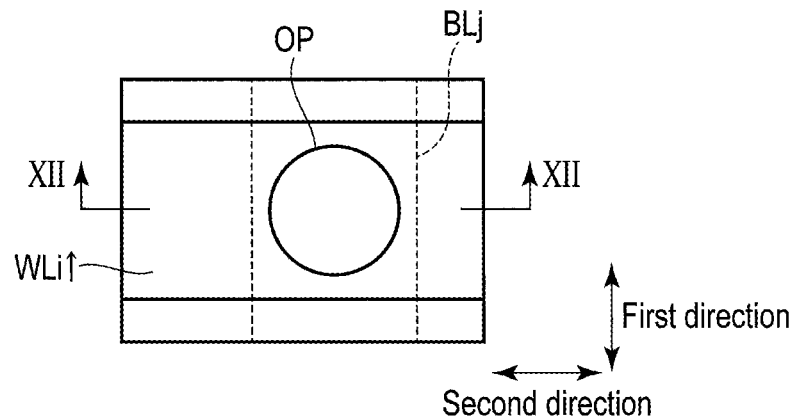
FIG. 11 is a plan view showing one of the steps of the manufacturing method of the select transistor.
Figure 12:
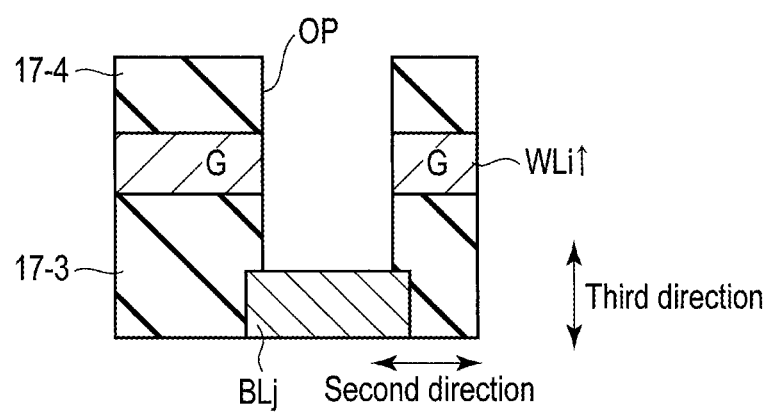
FIG. 12 is a cross-sectional view along XII-XII of FIG. 11.

As shown in FIG. 9 and FIG. 10, an interlayer insulating layer 17-1 covering capacitor $Cij_\downarrow$ and an interlayer insulating layer 17-2 covering word line $WLi_\downarrow$ are formed. Otherwise, as shown in FIG. 11 and FIG. 12, an interlayer insulating layer 17-3 covering bit line BLj and an interlayer insulating layer 17-4 covering word line $WLi_\uparrow$ are formed.

After that, an opening (a via or through-hole) OP is formed in interlayer insulating layers 17-1 and 17-2 or 17-3 and 17-4 by, for example, PEP and RIE. As shown in FIG. 9 and FIG. 11, the opening OP is aligned so as to penetrate word line $WLi_\downarrow$ or $WLi_\uparrow$. The bottom of the opening OP reaches cell electrode portion $14_\downarrow$ or bit line BLj.

Figure 13:
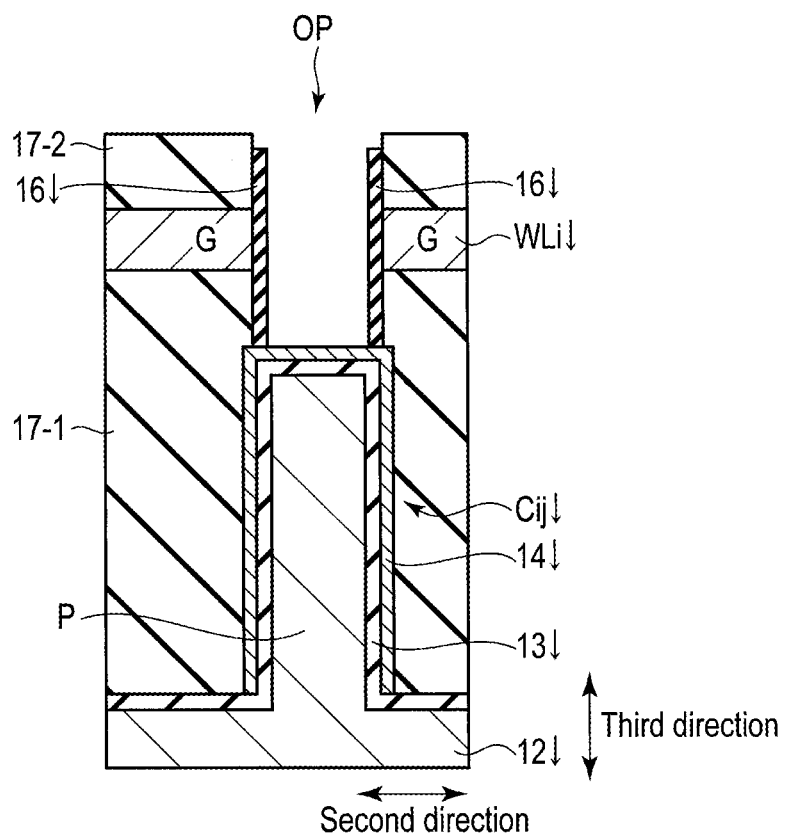
Figure 14:
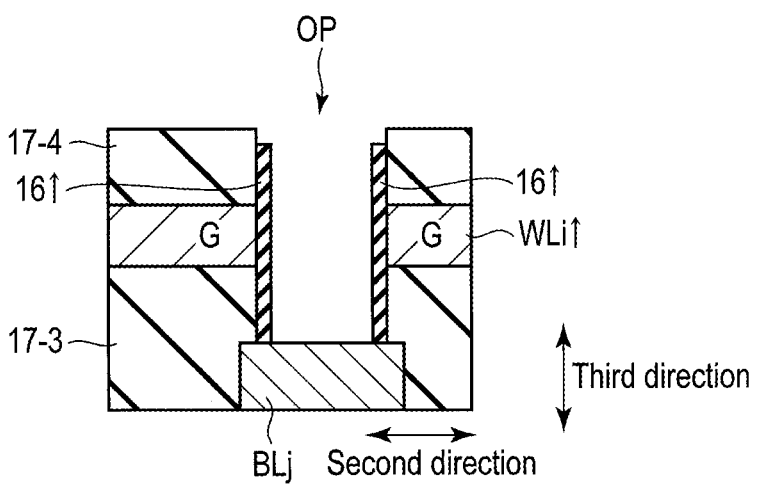

Next, as shown in FIG. 13 and FIG. 14, gate insulating layer $16_\downarrow$ or $16_\uparrow$ is formed on interlayer insulating layer 17-2 and the inner surface of the opening OP, or on interlayer insulating layer 17-4 and the inner surface of the opening OP by, for example, CVD. Following that, gate insulating layer $16_\downarrow$ or $16_\uparrow$ is etched by, for example, RIE, such that gate insulating layer $16_\downarrow$ or $16_\uparrow$ is left on the side surface of word line $WLi_\downarrow$ or $WLi_\uparrow$ (gate electrode G) exposed inside the opening OP.

Figure 15:
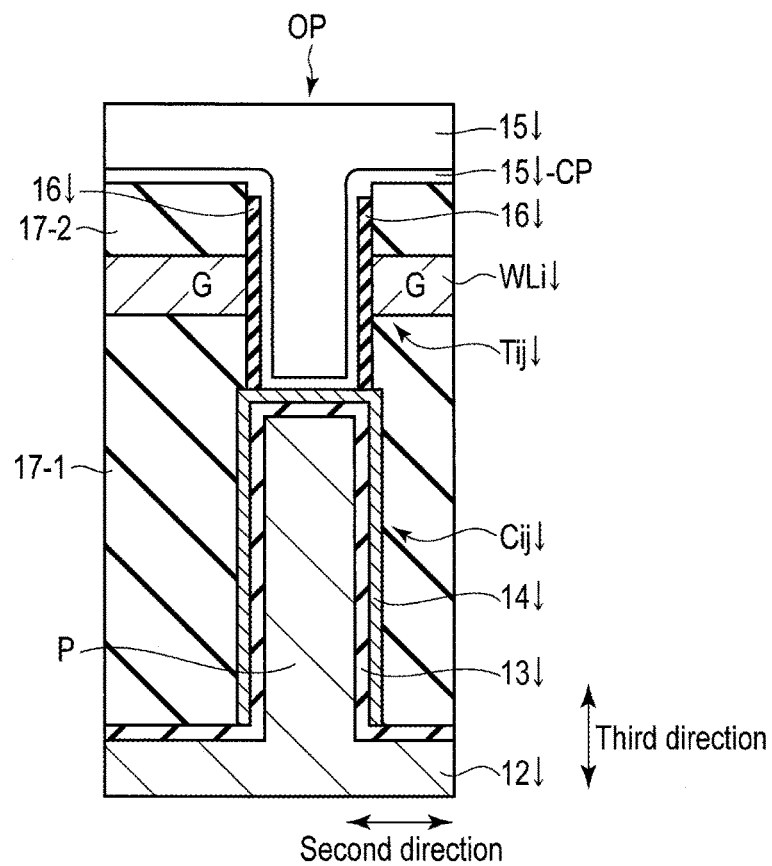
Figure 16:
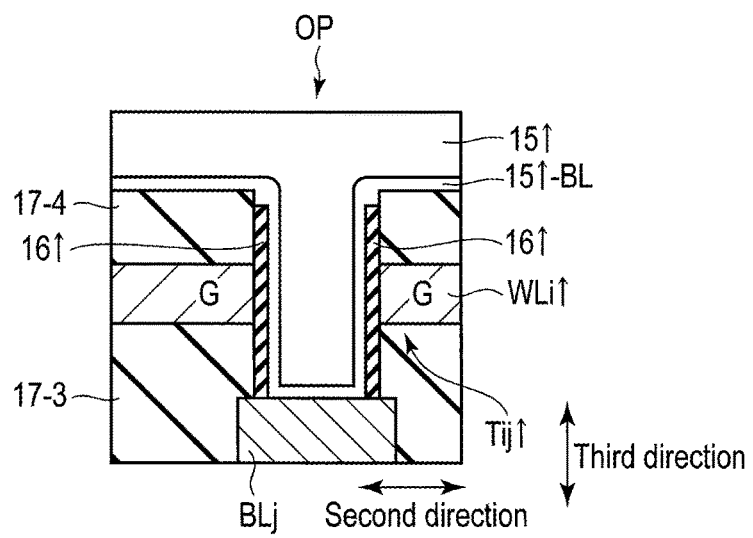

Next, as shown in FIG. 15 and FIG. 16, supplemental layer $15_\downarrow$-CP or $15_\uparrow$-BL is formed on interlayer insulating layer 17-2 and the inner surface of the opening OP, or on interlayer insulating layer 17-4 and the inner surface of the opening OP by, for example, CVD. Then, oxide semiconductor layer $15_\downarrow$ or $15_\uparrow$ with which the opening OP is completely filled is formed on interlayer insulating layer 17-2 or 17-4 by, for example, CVD.

Since supplemental layer $15_\downarrow$-CP or $15_\uparrow$-BL is formed of a material which hardly forms metal oxide on the surface of electrode portion $14_\downarrow$ or bit line BLj as described above, the contact resistance between oxide semiconductor layer $15_\downarrow$ and electrode portion $14_\downarrow$ and the contact resistance between oxide semiconductor layer $15_\uparrow$ and bit line BLj can be reduced.

In addition, since supplemental layers $15_\downarrow$-CP and $15_\uparrow$-BL which reduce interface scattering of carriers moving through a channel are present between oxide semiconductor layers $15_\downarrow$ and $15_\uparrow$ as a channel of select transistors $Tij_\downarrow$ and $Tij_\uparrow$ and gate insulating layers $16_\downarrow$ and $16_\uparrow$, channel mobility of carriers can be improved in select transistors $Tij_\downarrow$ and $Tij_\uparrow$ as described above.

Figure 17:
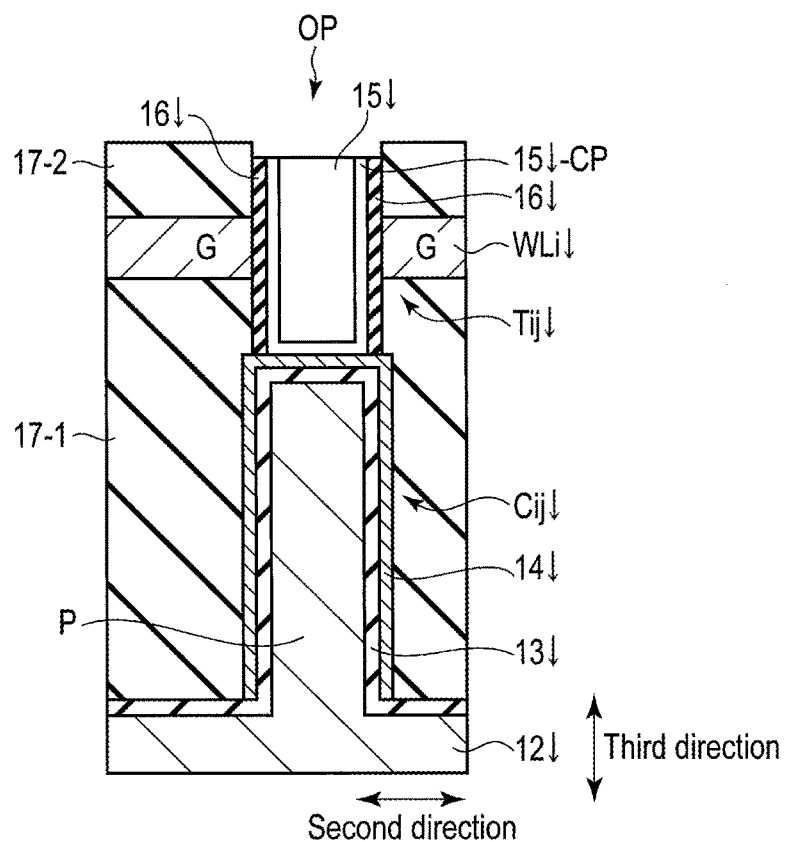
Figure 18:
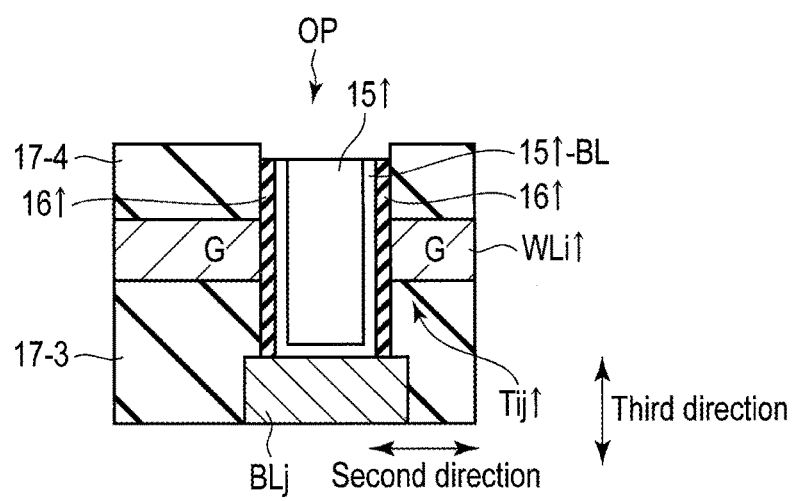

Next, as shown in FIG. 17 and FIG. 18, oxide semiconductor layer $15_\downarrow$ or $15_\uparrow$ and supplemental layer $15_\downarrow$-CP or $15_\uparrow$-BL are polished by, for example, the first CMP, such that these layers are left inside the opening OP. The first CMP is performed until the surface of interlayer insulating layer 17-2 or 17-4 is exposed. In the first CMP, ingredients of slurry are selected such that the etching rate of oxide semiconductor layer $15_\downarrow$ or $15_\uparrow$ and the etching rate of supplemental layer $15_\downarrow$-CP or $15_\uparrow$-BL are greater than the etching rate of interlayer insulating layer 17-2 or 17-4.

The first CMP is performed by so-called over etching, in which etching (polishing) is continued even after the upper surface (a surface in the third direction) of interlayer insulating layer 17-2 or 17-4 is exposed. As a result, the upper surface of oxide semiconductor layer $15_\downarrow$ or $15_\uparrow$ and the upper surface of supplemental layer $15_\downarrow$-CP or $15_\uparrow$-BL are below the upper surface of interlayer insulating layer 17-2 or 17-4 (i.e., closer to the semiconductor substrate 11 than interlayer insulating layer 17-2 or 17-4).

Next, as shown in FIG. 19 and FIG. 20, supplemental layer $15_\downarrow$-BL or $15_\uparrow$-CP is formed on interlayer insulating layer 17-2 or 17-4 and oxide semiconductor layer $15_\downarrow$ or $15_\uparrow$. Next, supplemental layer $15_\downarrow$-BL or $15_\uparrow$-CP is polished by the second CMP such that the layer is left inside the opening OP. The second CMP is performed until the surface of interlayer insulating layer 17-2 or 17-4 is exposed. In the second CMP, ingredients of slurry are selected such that the etching rate of supplemental layer $15_\downarrow$-BL or $15_\uparrow$-CP is greater than the etching rate of interlayer insulating layer 17-2 or 17-4.

Differently from the first CMP, etching (polishing) is stopped when the upper surface of interlayer insulating layer 17-2 or 17-4 is exposed in the second CMP. As a result, the upper surface of supplemental layer $15_\downarrow$-BL or $15_\uparrow$-CP is substantially flush with the upper surface of interlayer insulating layer 17-2 or 17-4.

By the above process, oxide semiconductor layer $15_\downarrow$ is surrounded by supplemental layers $15_\downarrow$-CP and $15_\downarrow$-BL and oxide semiconductor layer $15_\uparrow$ is surrounded by supplemental layers $15_\uparrow$-BL and $15_\uparrow$-CP.

Figure 21:
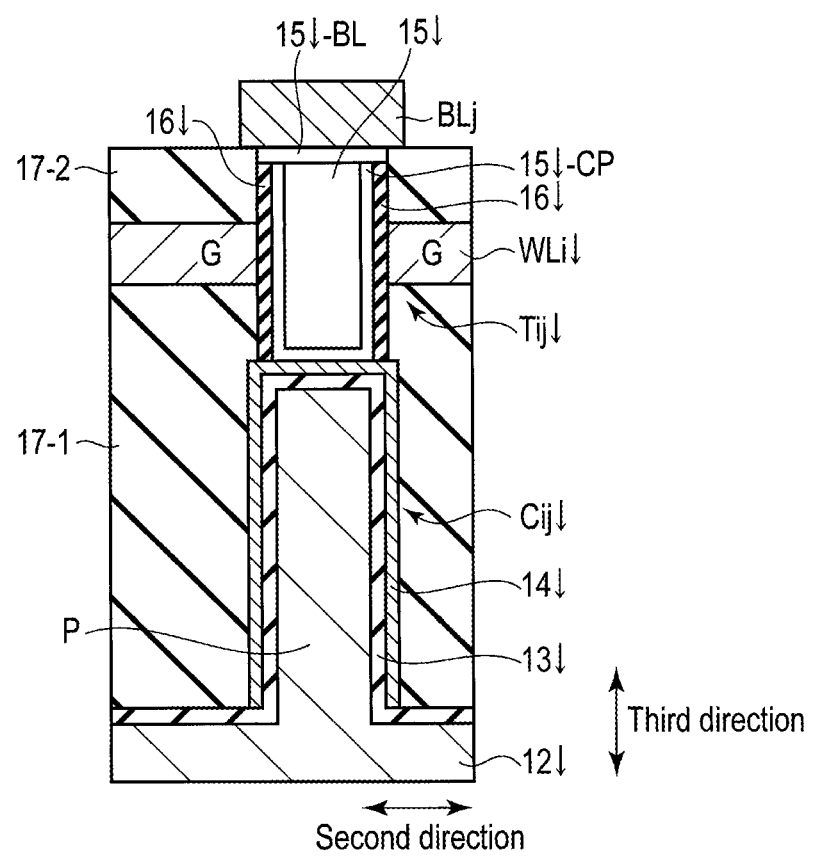

Next, as shown in FIG. 21, for example, memory cell MCij in memory cell array $MA_\downarrow$ of FIG. 3 is formed by forming bit line BLj on supplemental layer $15_\downarrow$-BL. Since supplemental layer $15_\downarrow$-BL is formed of a material which hardly forms metal oxide on the (lower) surface of bit line BLj as described above, the contact resistance between oxide semiconductor layer $15_\downarrow$ and bit line BLj can be reduced.

In the same manner, as shown in FIG. 22, for example, memory cell MCij in memory cell array $MA_\uparrow$ of FIG. 3 is formed by forming capacitor $Cij_\uparrow$ on supplemental layer $15_\uparrow$-CP. Capacitor $Cij_\uparrow$ comprises a plate electrode $12_\uparrow$ (including a pillar portion P), an insulating portion $13_\uparrow$ and a cell electrode portion $14_\uparrow$. These can easily be formed by a combination of a deposition method such as CVD, a processing method such as PEP and an etching/polishing method such as RIE/CMP.

Since supplemental layer $15_\uparrow$-CP is formed of a material which hardly forms metal oxide on the (lower) surface of electrode portion $14_\uparrow$, the contact resistance between oxide semiconductor layer $15_\uparrow$ and electrode portion $14_\uparrow$ can be reduced.

Application Example

An application example of the DRAM of FIG. 3 and FIG. 4 is described.

FIG. 23 is a plan view of the DRAM. FIG. 24A and FIG. 24B are cross-sectional views along XXIV-XXIV of FIG. 23.

In the example of FIG. 24A, units U0, U1, . . . are stacked on the semiconductor layer 11. Each of units U0, U1, . . . comprises two memory cell arrays $MA_\downarrow$ and $MA_\uparrow$ T shown in FIG. 3 and FIG. 4. That is, as shown in area X of FIG. 24A, each of bit lines BL_1st and BL_2nd is shared by two memory cell arrays $MA_\downarrow$ and $MA_\uparrow$.

Bit lines BL_1st and BL_2nd are connected to peripheral circuits (including sense amplifiers) 21 through contact plugs 18 and a transistor T. For example, the peripheral circuits 21 are disposed directly below units U0, U1, . . . .

For example, one of word lines $WL0_\downarrow$, $WL0_\uparrow$, $WL1_\downarrow$, $WL1_\uparrow$, $WL2_\downarrow$, $WL2_\uparrow$, . . . in one unit Uk (k=0, 1, . . . ) is selected at the time of reading/writing. The selected word line is activated (high potential) and the other word lines are deactivated (low potential).

As shown in area Y of FIG. 24A, a plate electrode 12_2nd ($12_\downarrow/12_\uparrow$) is shared by two units U0 and U1. Such sharing is possible because plate electrode 12_2nd is set at a fixed potential (for example, a ground potential). If plate electrodes 12_1st, 12_2nd and 12_3rd are connected to each other by contact plugs 19, the resistance of the electrodes can be reduced, which can prevent the fixed potential from being changed.

In the structure of FIG. 24A, plate electrode 12_1st, bit line BL_1st, plate electrode 12_2nd, bit line BL_2nd and plate electrode 12_3rd are disposed in this order from the semiconductor substrate 11 side, but the order can be changed.

For example, as shown in FIG. 24B, bit line BL_1st, plate electrode 12_1st, bit line BL_2nd, plate electrode 12_2nd and bit line BL_3rd may be disposed in this order from the semiconductor substrate 11 side. In FIG. 24B, elements which are identical to those in FIG. 24A are denoted by the same reference numbers and detailed description is omitted.

In the DRAM of the application example, n memory cell arrays $MA_\downarrow$ and $MA_\uparrow$ can be stacked on the semiconductor substrate 11. As a result, the horizontal size of each memory cell can be $4F^2/n$ (n is a natural number not less than one).

CONCLUSION

According to the above-described embodiment, the contact resistance of a transistor using an oxide semiconductor layer as a channel can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A transistor comprising:
   a first electrode;
   a second electrode;
   a current path between the first and second electrodes, the current path including an oxide semiconductor layer;
   a control terminal which controls an on/off action of the current path;
   an insulating layer between the control terminal and the oxide semiconductor layer;

a first oxide layer between the first electrode and the oxide semiconductor layer, the first oxide layer being different from the oxide semiconductor layer; and
a second oxide layer between the second electrode and the oxide semiconductor layer, the second oxide layer being different from the oxide semiconductor layer.

2. The transistor of claim 1, wherein
the first oxide layer is also disposed between the insulating layer and the oxide semiconductor layer.

3. The transistor of claim 1, wherein
the first and second oxide layers have standard energy of formation of oxide less than that of the oxide semiconductor layer.

4. The transistor of claim 1, wherein
the oxide semiconductor layer includes indium-gallium-zinc oxide, and
the first and second oxide layers include one of indium-gallium-silicon oxide and gallium oxide.

5. The transistor of claim 1, wherein
the oxide semiconductor layer includes indium-gallium-zinc oxide, and
the first and second oxide layers include one of aluminum oxide and hafnium oxide.

6. The transistor of claim 1, wherein
the first and second oxide layers have bandgap energy greater than that of the oxide semiconductor layer.

7. The transistor of claim 1, wherein
the first and second oxide layers include the same material.

8. The transistor of claim 1, wherein
the oxide semiconductor layer is surrounded by the first and second oxide layers.

9. The transistor of claim 1, wherein
the first and second electrodes include one of copper, tungsten and molybdenum.

10. The transistor of claim 1, wherein
the first and second electrodes are disposed above an upper surface of a semiconductor substrate, and
the current path extends in a direction crossing the upper surface of the semiconductor substrate.

11. The transistor of claim 1, wherein
the control terminal is a word line extending along an upper surface of a semiconductor substrate, and
the oxide semiconductor layer penetrates the word line.

12. A semiconductor memory device comprising:
a semiconductor substrate; a first capacitor above a surface of the semiconductor substrate; a first transistor on the first capacitor; a second transistor above the first transistor; a second capacitor on the first transistor; and a bit line between the first and second transistors,
wherein the first capacitor comprises a first plate electrode, a first cell electrode portion above the first plate electrode, and a first insulating portion between the first plate electrode and the first cell electrode portion,
the first transistor comprises a first word line between the first cell electrode portion and the bit line, a first oxide semiconductor layer connected between the first cell electrode portion and the bit line and penetrating the first word line, a first gate insulating layer between the first word line and the first oxide semiconductor layer, a first oxide layer between the first cell electrode portion and the first oxide semiconductor layer, the first oxide layer being different from the first oxide semiconductor layer, and a second oxide layer between the bit line and the first oxide semiconductor layer, the second oxide layer being different from the first oxide semiconductor layer,
the second capacitor comprises a second cell electrode portion, a second plate electrode above the second cell electrode portion, and a second insulating portion between the second cell electrode portion and the second plate electrode, and
the second transistor comprises a second word line between the second cell electrode portion and the bit line, a second oxide semiconductor layer connected between the second cell electrode portion and the bit line and penetrating the second word line, a second gate insulating layer between the second word line and the second oxide semiconductor layer, a third oxide layer between the second cell electrode portion and the second oxide semiconductor layer, the third oxide layer being different from the second oxide semiconductor layer, and a fourth oxide layer between the bit line and the second oxide semiconductor layer, the fourth oxide layer being different from the second oxide semiconductor layer.

13. The device of claim 12, further comprising
a conductor connected between the first and second plate electrodes.

14. The device of claim 12, wherein
the first and second word lines intersect with the bit line.

15. The device of claim 12, further comprising
a sense amplifier on the semiconductor substrate, the bit line being connected to the sense amplifier.

16. The device of claim 15, wherein
the sense amplifier is disposed directly below the first and second transistors.

17. A semiconductor memory device comprising:
a semiconductor substrate; a first bit line above a surface of the semiconductor substrate; a first transistor on the first bit line; a first capacitor on the first transistor; a second capacitor on the first capacitor; a second transistor on the second capacitor; and a second bit line on the second transistor,
wherein the first capacitor comprises a first cell electrode portion, a first plate electrode above the first cell electrode portion, and a first insulating portion between the first cell electrode portion and the first plate electrode,
the first transistor comprises a first word line between the first cell electrode portion and the first bit line, a first oxide semiconductor layer connected between the first cell electrode portion and the first bit line and penetrating the first word line, a first gate insulating layer between the first word line and the first oxide semiconductor layer, a first oxide layer between the first cell electrode portion and the first oxide semiconductor layer, the first oxide layer being different from the first oxide semiconductor layer, and a second oxide layer between the first bit line and the first oxide semiconductor layer, the second oxide layer being different from the first oxide semiconductor layer,
the second capacitor comprises a second plate electrode, a second cell electrode portion above the second plate electrode, and a second insulating portion between the second plate electrode and the second cell electrode portion,
the second transistor comprises a second word line between the second cell electrode portion and the second bit line, a second oxide semiconductor layer connected between the second cell electrode portion and the second bit line and penetrating the second word line, a second gate insulating layer between the second word line and the second oxide semiconductor layer, a third oxide layer between the second cell electrode portion and the second oxide semiconductor layer, the third oxide layer being different from the second oxide semiconductor layer, and a fourth oxide layer between the second bit line and the second oxide semiconductor layer, the fourth oxide layer being different from the second oxide semiconductor layer, and the first and second plate electrodes are the same electrode.

18. The device of claim 17, wherein the first and second word lines intersect with the first and second bit lines.

19. The device of claim 17, further comprising a sense amplifier on the semiconductor substrate, one of the first and second bit lines being connected to the sense amplifier.

20. The device of claim 19, wherein the sense amplifier is disposed directly below the first and second transistors.

* * * * *